United States Patent

Okumura

[11] Patent Number: 5,814,919
[45] Date of Patent: Sep. 29, 1998

[54] ELECTRO-MECHANICAL ENERGY CONVERSION ELEMENT AND A VIBRATION WAVE ACTUATOR USING THE ELECTRO-MECHANICAL ENERGY CONVERSION ELEMENT

[75] Inventor: Ichiro Okumura, Yokohama, Japan

[73] Assignee: Canon Kabushiki Kaisha, Toyko, Japan

[21] Appl. No.: 636,466

[22] Filed: Apr. 23, 1996

[30] Foreign Application Priority Data

Apr. 28, 1995 [JP] Japan .................................... 7-106041
Aug. 31, 1995 [JP] Japan .................................... 7-223220

[51] Int. Cl.$^6$ .................................................. H01L 41/08
[52] U.S. Cl. ............................................ 310/323; 310/366
[58] Field of Search .................................. 310/316, 317, 310/323, 325, 328, 366, 333

[56] References Cited

U.S. PATENT DOCUMENTS

| 4,759,107 | 7/1988 | Ogawa et al. .................... 310/328 X |
| 5,231,325 | 7/1993 | Tamai et al. ........................ 310/323 |
| 5,345,137 | 9/1994 | Funakubo et al. ................. 310/323 |
| 5,410,204 | 4/1995 | Imabayashi et al. .............. 310/323 |
| 5,448,128 | 9/1995 | Endo et al. ......................... 310/323 |
| 5,548,176 | 8/1996 | Oda ..................................... 310/328 |
| 5,585,685 | 12/1996 | Maeno et al. ..................... 310/323 |

FOREIGN PATENT DOCUMENTS

| 0584775 | 3/1994 | European Pat. Off. . |
| 0661764 | 7/1995 | European Pat. Off. . |
| 7193201 | 7/1995 | Japan . |

Primary Examiner—Mark O. Budd
Attorney, Agent, or Firm—Fitzpatrick, Cella, Harper & Scinto

[57] ABSTRACT

A stack type energy conversion element includes a first electro-mechanical energy conversion element having a plurality of driving electrodes as a first group, all of which are polarized in a first direction, and a second electro-mechanical energy conversion element having a plurality of driving electrodes as a second group, all of which are polarized in a second direction in which an inverse characteristic to that in the first direction is obtained, wherein the first and second energy conversion elements are stacked on each other such that phases of the electrodes of the first group are shifted from those of the electrodes of the second group.

29 Claims, 22 Drawing Sheets

FIRST LAYER

SECOND LAYER

THIRD LAYER $V_A$ $V_B$ $V_C$ t

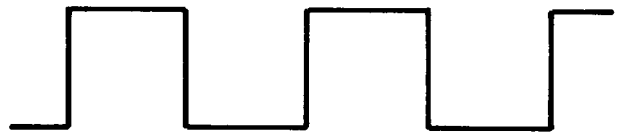
FIG. 25A
$V_A$
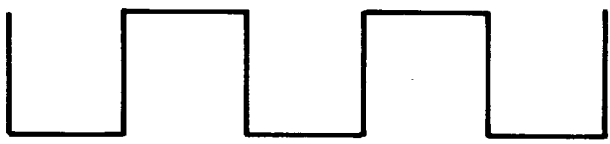
FIG. 25B
$V_B$
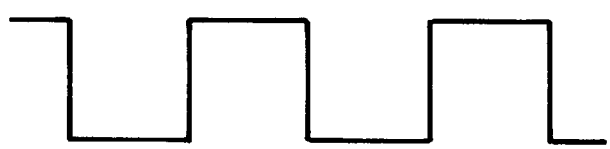
FIG. 25C
$V_C$
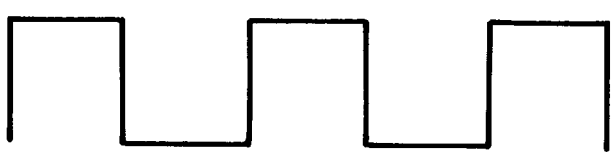
FIG. 25D
$V_D$

5,814,919

ELECTRO-MECHANICAL ENERGY CONVERSION ELEMENT AND A VIBRATION WAVE ACTUATOR USING THE ELECTRO-MECHANICAL ENERGY CONVERSION ELEMENT

BACKGROUND OF THE INVENTION

1. Field of the Invention The present invention relates to an electro-mechanical energy conversion element and a vibration wave actuator for generating a vibration wave using the electro-mechanical energy conversion element.

2. Related Background Art

As a device using a piezoelectric element serving as an electro-mechanical energy conversion element, a driving source for a vibration wave motor is known. As such an element, a stack (laminate) type piezoelectric element has been proposed. This element has a stack type structure and is capable of obtaining a high output at a low voltage.

FIG. 12 is an exploded perspective view of a stack type piezoelectric element obtained by stacking six piezoelectric element plates 5-1, 5-2, 5-3, 5-4, 5-5, and 5-23 each obtained by forming a piezoelectric member into a four-way divided electrode pattern. Only the four piezoelectric element plates 5-2, 5-3, 5-4, and 5-5, excluding the piezoelectric element plate 5-1 as the uppermost layer and the piezoelectric element plate 5-23 as the lowermost layer, are actually used for a driving operation. The electrode films of the piezoelectric element plate as the uppermost layer are used for a polarization process, and only the divided electrode films of the piezoelectric element plate as the lowermost layer are used for a driving operation.

Each of these piezoelectric element plates has a four-way divided electrode film pattern. The electrode films of the piezoelectric element plates 5-3, 5-4, and 5-5 which oppose each other have different polarization directions. Pairs of in-phase electrode films 18A1 and 20A1, 18A2 and 20A2, 18B1 and 20B1, and 18B2 and 20B2 of the piezoelectric element plates 5-3 and 5-5 are respectively connected to electrode films 13A1, 13A2, 13B1, and 13B2 of the piezoelectric element plate 5-1 as the uppermost layer and electrode films 20'A1, 20'A2, 20'B1, and 20'B2 of the piezoelectric element plate as the lowermost layer via conductive lines 15A1, 15A2, 15B1, and 15B2 extending through through holes 14.

In-phase electrode films 16A, 16B, 19Al, 19B1, 19A2, 19B1, and 19B2 of the piezoelectric element plates 5-2 and 5-4 are connected to each other via conductive lines 15GA and 15GB extending through the through holes 14, and are connected to electrode films 13GA and 13GB of the piezoelectric element plate as the uppermost layer. This element also includes a vibration detection electrode 16A2.

When the stack type piezoelectric element having this structure is driven by a two-phase AC voltage with a phase difference of 90° or a four-phase AC voltage, bending vibrations are excited with respect to two axes perpendicular to the axis in the direction of thickness, and are synthesized to excite elliptic motions on the driving surface of a Langevin vibrator which clamps this stack type piezoelectric element, thereby performing frictional driving of a member pressed against the driving surface.

In the above stack type piezoelectric element, however, the division number is large, and hence the number of ineffective piezoelectric ceramic portions (having no electrode films formed thereon) between the electrodes of each piezoelectric element plate increases. In a rod-shaped vibration wave motor having a small diameter, in particular, an increase in the ratio of ineffective portions interferes with a reduction in the size of the device.

The above stack type piezoelectric element can be driven in the two- or four-phase mode. In the four-phase driving mode, the same amplitude can be obtained at a voltage ½ that in the two-phase driving mode. That is, the four-phase driving mode is suitable for a low-voltage driving operation. FIG. 13 shows a driving circuit for this four-phase driving mode. Referring to FIG. 13, this circuit includes a microcomputer ($\mu$-com.) 48 for controlling the overall circuit, an oscillator 42, a phase shifter 43, and switching circuits 44A and 44A' for outputting pulse driving signals on the basis of a driving signal from the oscillator 42. These switching circuits drive the A and A' phases of the piezoelectric element 2. The circuit also includes switching circuits 45B and 45B' for outputting pulse driving signals on the basis of a driving signal from the phase shifter 43. These switching circuits drive the B and B' phases of the piezoelectric element 2. Coils 46 and 47 are used to amplify driving pulse signals.

In this mode, however, the output portions (amplifiers) of the driving circuit require transistors twice in number to those in the two-phase driving mode.

In addition, in the above stack type piezoelectric element, there are portions having different polarization polarities in one layer. For this reason, some portion is polarized in the planar direction.

SUMMARY OF THE INVENTION

According to one aspect of the invention, there is provided a stack type energy conversion element obtained by stacking a first electro-mechanical energy conversion element having a plurality of driving electrodes, all of which are polarized in a first direction, and a second electro-mechanical energy conversion element having a plurality of driving electrodes, all of which are polarized in a second direction, wherein phases of the electrodes of the first and second electro-mechanical energy conversion elements are shifted from each other.

According to one aspect of the invention, there is provided a stack type energy conversion element obtained by stacking at least three electro-mechanical energy conversion elements, each having a plurality of divided driving electrodes, wherein phases of the electrodes are shifted from each other, and the elements are driven by three-phase AC signals.

According to one aspect of the invention, there is provided a stack type energy conversion element obtained by stacking a plurality of electro-mechanical energy conversion elements, each having three divided driving electrodes, wherein phases of the electrodes are shifted from each other.

According to one aspect of the invention, there is provided a stack type energy conversion element obtained by stacking a plurality of electro-mechanical energy conversion elements, each having at least three divided driving electrodes, wherein phases of the electrodes are shifted from each other, the electrodes to which identical AC signals are supplied are connected to each other by a conductor using a through hole, and the through hole is positioned at a boundary region between the electrodes to which other AC signals are supplied.

BRIEF DESCRIPTION OF THE DRAWINGS

FIGS. 25A to 25D are timing charts showing AC voltages for driving an ultrasonic motor according to the fifth embodiment;

DETAILED DESCRIPTION OF THE PREFERRED EMBODIMENTS (First Embodiment)

Figure 1:
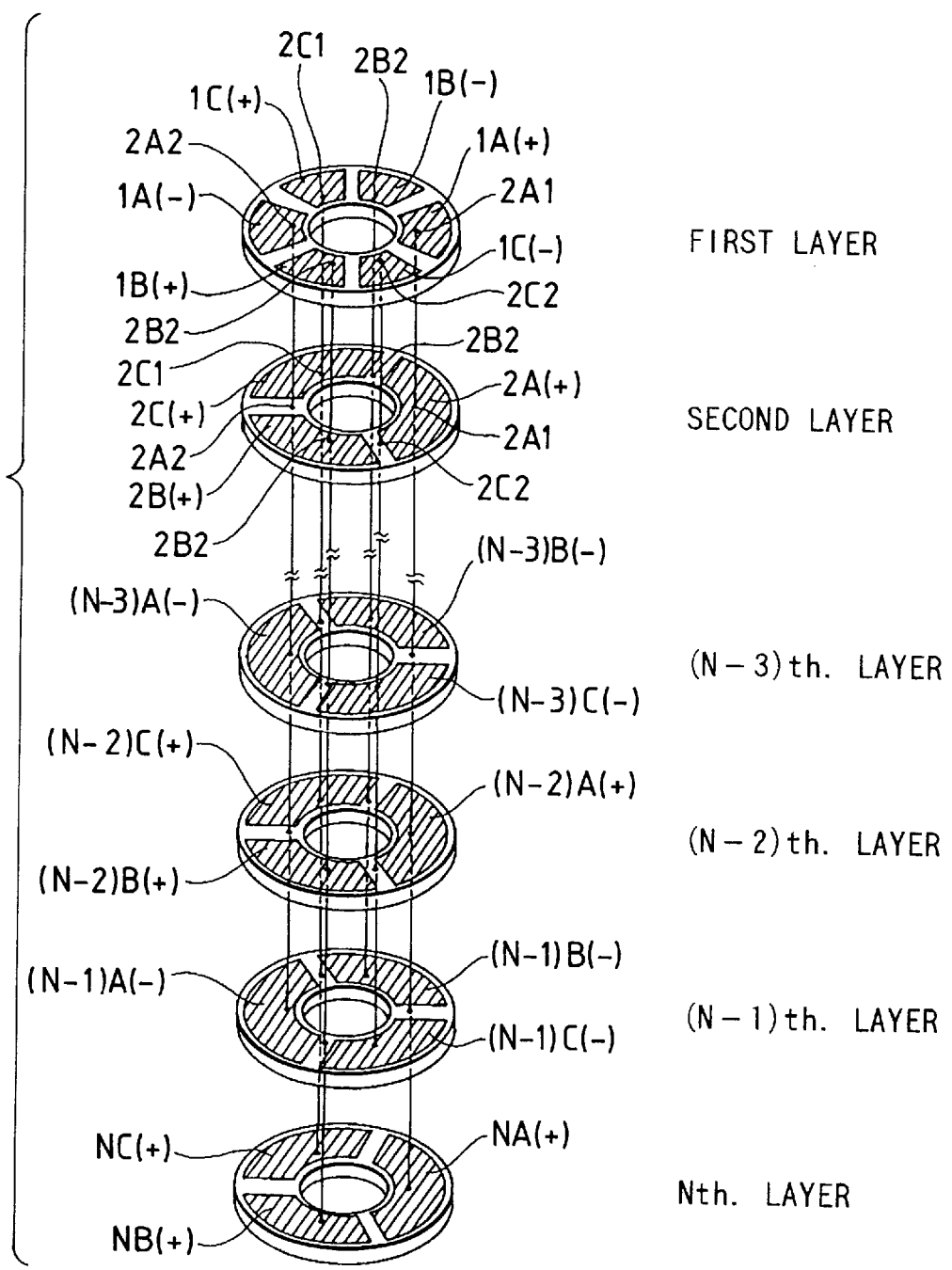
FIG. 1 is an exploded perspective view showing a stack type piezoelectric element according to the first embodiment of the present invention.

FIG. 1 shows the first embodiment of the present invention.

A stack type piezoelectric element of this embodiment is obtained by stacking N piezoelectric element plates. Each of the piezoelectric element plates except for the piezoelectric element plate as the uppermost layer (first layer) has three divided electrode films formed on a piezoelectric member. These films are stacked with a phase difference of 120°. The piezoelectric element plate as the uppermost layer is divided into six portions.

Although the polarization direction of each piezoelectric element plate will be described later, each piezoelectric element plate is polarized in the same polarity (same direction) as a whole.

Referring to FIG. 1, each of the piezoelectric element plates except for the piezoelectric element plate as the lowermost layer have six through holes 2A1, 2A2, 2B1, 2B2, 2C1, and 2C2 as through holes formed at equal intervals in the circumferential direction to extend through in the direction of thickness. Six divided electrodes 1A(+), 1A(−), 1B(+), 1B(−), 1C(+), and 1C(−) formed on the upper surface of the piezoelectric element plate as the uppermost layer at almost equal intervals are connected to the respective through holes described above.

Three divided electrodes 2A(+), 2B(+), and 2C(+) are printed on the piezoelectric element as the second layer, and the three through holes 2A1, 2B1 and 2C1 are connected to these electrodes. The three remaining through holes 2A2, 2B2, and 2C2 are insulated from the printed electrodes.

Each even-numbered layer, e.g., the fourth, sixth, or eighth layer has the same structure as that of the second layer or the (N−2)th layer. The through hole 2A1 connects even-numbered layer electrodes 2A(+), 4A(+), 6A(+), . . . , (N–2)A(+) to each other. The through-hole 2B1 connects even-numbered layer electrodes 2B(+), 4B(+), . . . , (N–2)B(+), and NB(+) to each other. The through hole 2C1 connects even-numbered layer electrodes 2C(+), 4C(+), . . . , (N–2)C(+) to each other.

Each odd-numbered layer, e.g., the third, fifth or seventh layer, like the (N–3)th layer or the (N–1)th layer in FIG. 1 has an electrode pattern rotated through 180° from the position of the electrode pattern of each even-numbered layer. The through hole 2A2 connects odd-numbered layer electrodes 3A(–), . . . , (N–3)A(–), and (N–1)A(–) to each other. The through hole 2B2 connects odd-numbered layer electrodes 3B(–), . . . , (N–3)B(–), and (N–1)B(–) to each other. The through hole 2C2 connects odd-numbered layer electrodes 3C(–), . . . , (N–3)C(–), and (N–1)C(–) to each other. These piezoelectric element plates, each made of a green sheet, are pressure-welded and integrally sintered.

Figure 2:
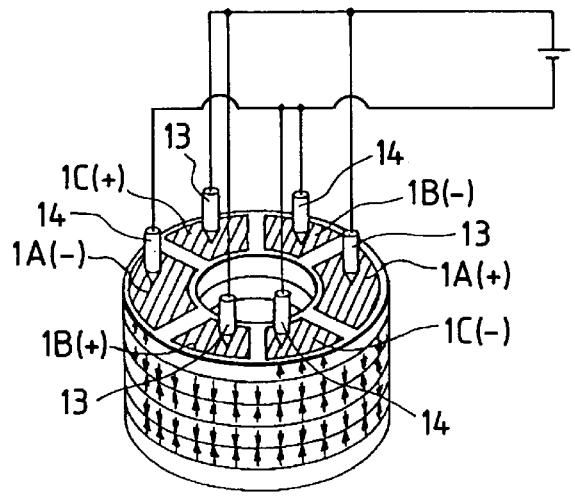
FIG. 2 is a perspective view showing a polarization process for the stack type piezoelectric element in FIG. 1.

FIG. 2 shows a polarization method for the stack type piezoelectric element in FIG. 1. Referring to FIG. 2, the polarities of applied voltages and the polarization directions in the piezoelectric element are indicated by the arrows. A positive potential is applied to the first layer electrode 1A(+), 1B(+), and 1C(+) via a positive contact pin 13, and a negative potential is applied to the electrodes 1A(–), 1B(–), and 1C(–) via a negative contact pin 14, thereby performing a polarization process. The piezoelectric element plates except for the piezoelectric elements as the first layer (uppermost layer) and the Nth layer (lowermost layer) are alternately and uniformly polarized to the same polarity.

Figure 3:
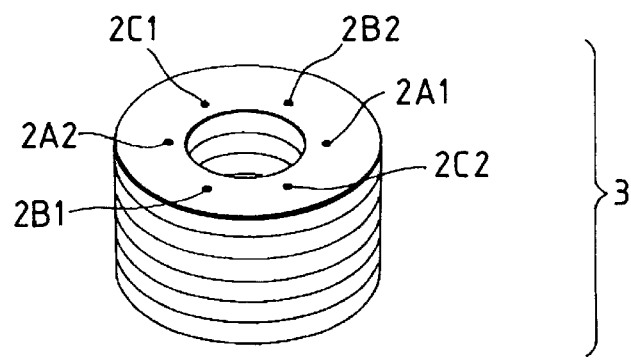
FIG. 3 is a perspective view showing the outer appearance of the stack type piezoelectric element in a completed state after the polarization process.

FIG. 3 shows a stack type piezoelectric element 3 obtained by removing the electrode as the first layer after a polarization process to expose through holes 2A1, 2A2, 2B1, 2B2, 2C1, and 2C2. As is apparent, the stack type piezoelectric element 3 becomes a piezoelectric element after polarization, but is only a ceramic material before polarization.

Figure 4A:
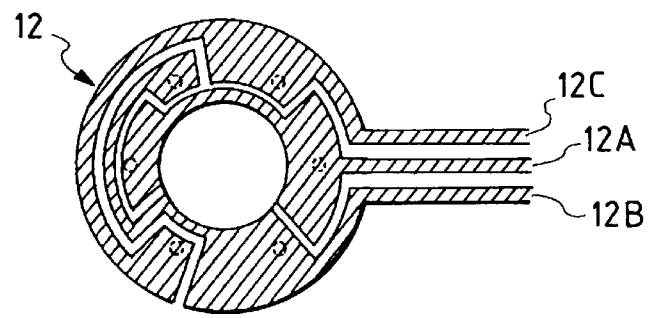
FIGS. 4A and 4B are plan views showing the positional relationship between the conductive portions of a flexible printed board to be connected to the stack type piezoelectric element in FIG. 3 and through holes.
Figure 5:
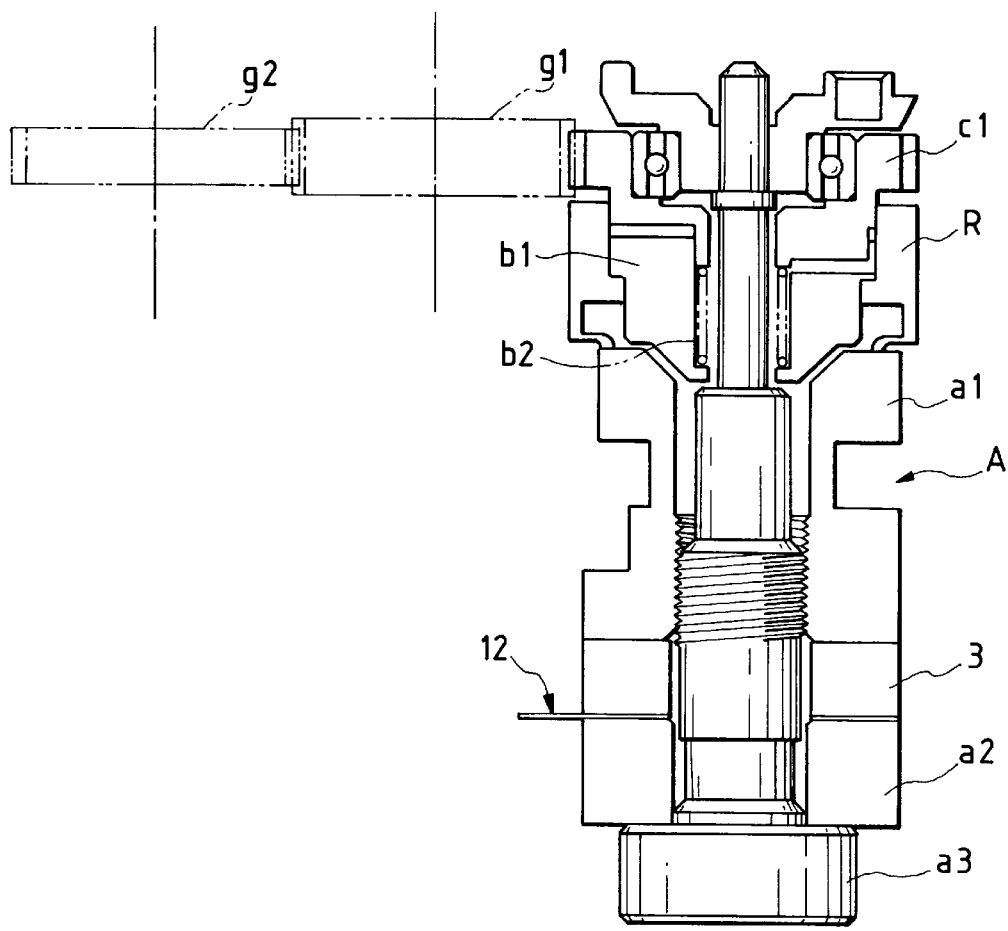
FIG. 5 is a sectional view showing a rod-shaped vibration wave motor having the stack type piezoelectric element in FIG. 3 mounted in a vibrator.

This stack type piezoelectric element 3 is clamped between elastic vibration members a1 and a2 as the driving portions of a vibrator A of a rod-shaped ultrasonic motor in FIG. 5, and is clamped/fixed by fastening the elastic vibration members a1 and a2 with a bolt a3. In this case, conductive patterns 12A, 12B, and 12C (FIG. 4A) of a flexible printed board 12 are brought into tight contact with the through hole side in FIG. 3.

Figure 7:
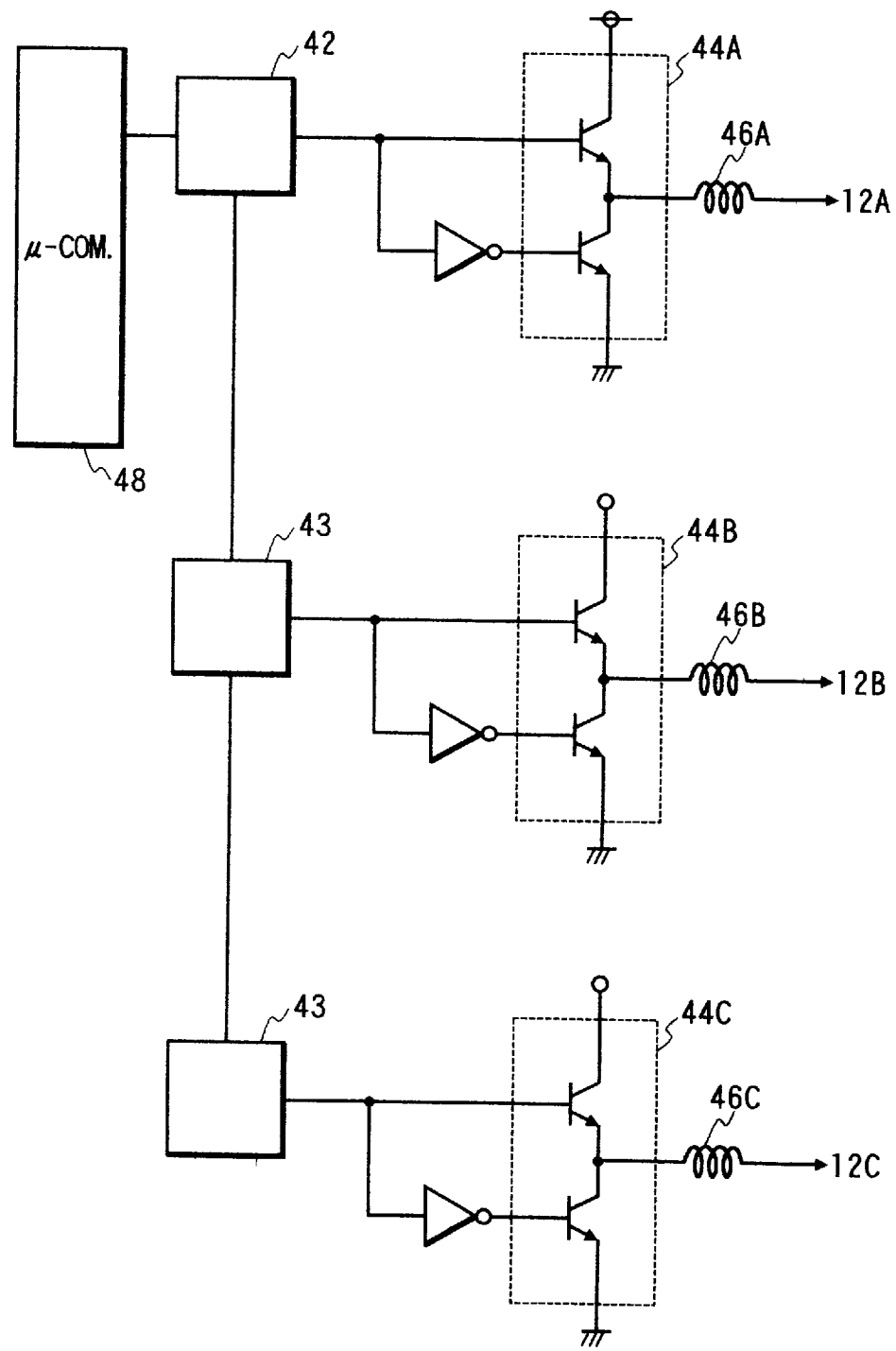
FIG. 7 is a circuit diagram showing a driving circuit for the vibration wave motor in FIG. 5.

In this rod-shaped ultrasonic motor, when AC voltages are applied from the driving circuit in FIG. 7 to the piezoelectric element 3 of the vibrator A, elliptic motions are excited on the end face of the elastic vibration member a1. The flange shaped spring of a rotor R as a moving object is pressed against the end face of the elastic vibration member via a coil spring. This pressing force is given by the spring force of a compression spring b2 via a spring bearing member b1.

The rotor R is frictionally driven by elliptic motions produced on the elastic vibration member a1 of the vibrator A. The resultant rotational force is transferred to an output member c1 which has a gear portion formed on its outer surface and is rotated together with the rotor R. Note that the rotational force of the output member c1 is transferred to gears g1 and g2 constituting a driving system.

Figure 4B:
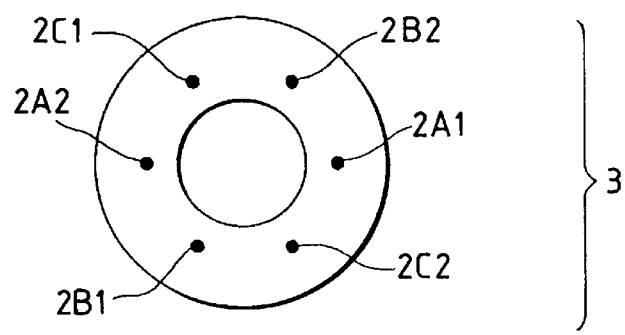

FIGS. 4A and 4B show the positional relationship between the conductive pattern of the flexible printed board 12 and the through holes 2A1, 2A2, 2B1, 2B2, 2C1 and 2C2 of the stack type piezoelectric element 3.

The conductive pattern 12A of the flexible printed board 12 is in contact with the through holes 2A1 and 2A2 of the stack type piezoelectric element 3. The conductive pattern 12B is in contact with the through holes 2B1 and 2B2. The conductive pattern 12C is in contact with the through holes 2C1 and 2C2.

Figure 6:
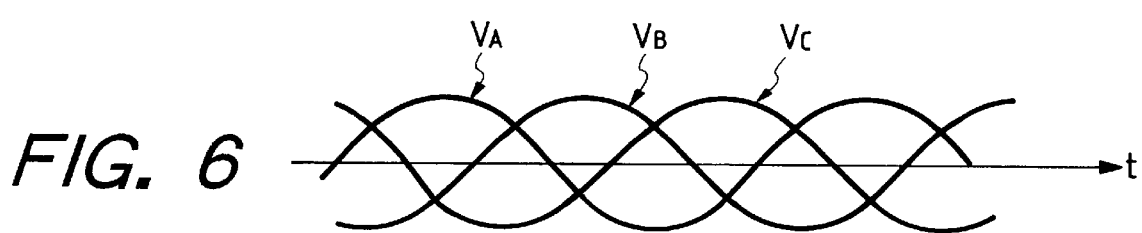
FIG. 6 is a timing chart showing changes in driving voltages for the vibration wave motor in FIG. 5 over time.

FIG. 6 shows three-phase AC voltages to be applied to the conductive patterns 12A, 12B, and 12C of the flexible printed board 12 when this rod-shaped ultrasonic motor is driven. More specifically, these voltages are three-phase AC voltages having a phase difference of 120° from each other. As is known, the frequency is the bending natural frequency of the ultrasonic motor vibrator. Electric fields VA–VB, VB–VC, and VC–VA are applied between the electrodes of the stack type piezoelectric element 3. Note that when these phases are changed, the rotation of the motor is reversed.

Figure 13:
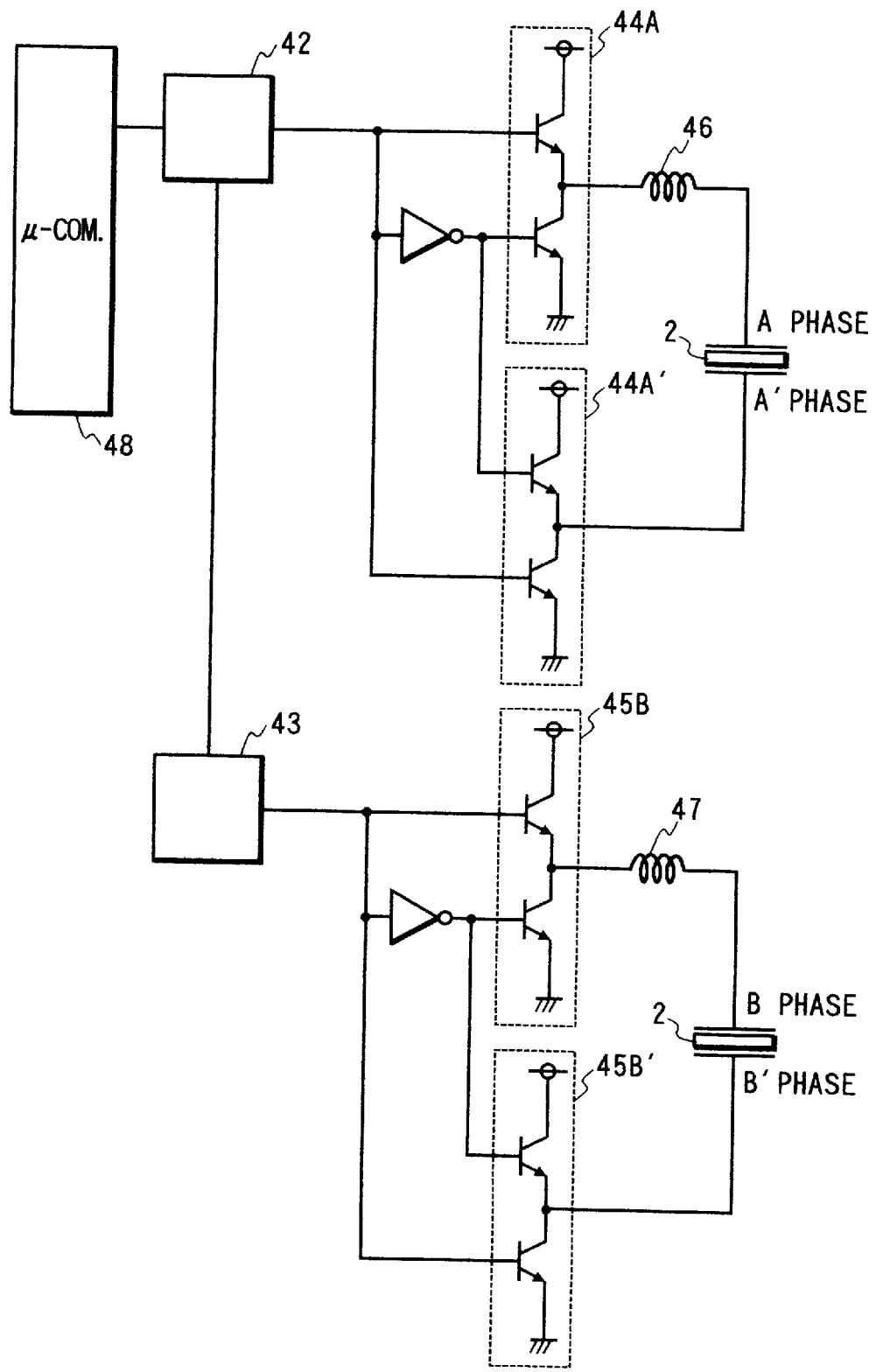
FIG. 13 is a circuit diagram showing a previously proposed driving circuit.

The driving circuit is basically the same as that shown in FIG. 13 except that a phase shifter 43 is a 120°/–120° phase shifter, and only three switching circuits 44A, 44B, and 44C are required because of the three-phase driving mode. Pulse voltages from the respective switching circuits are amplified by coils 46A, 46B, and 46C and applied to the conductive patterns 12A, 12B, and 12C.

(Second Embodiment)

Figure 8:
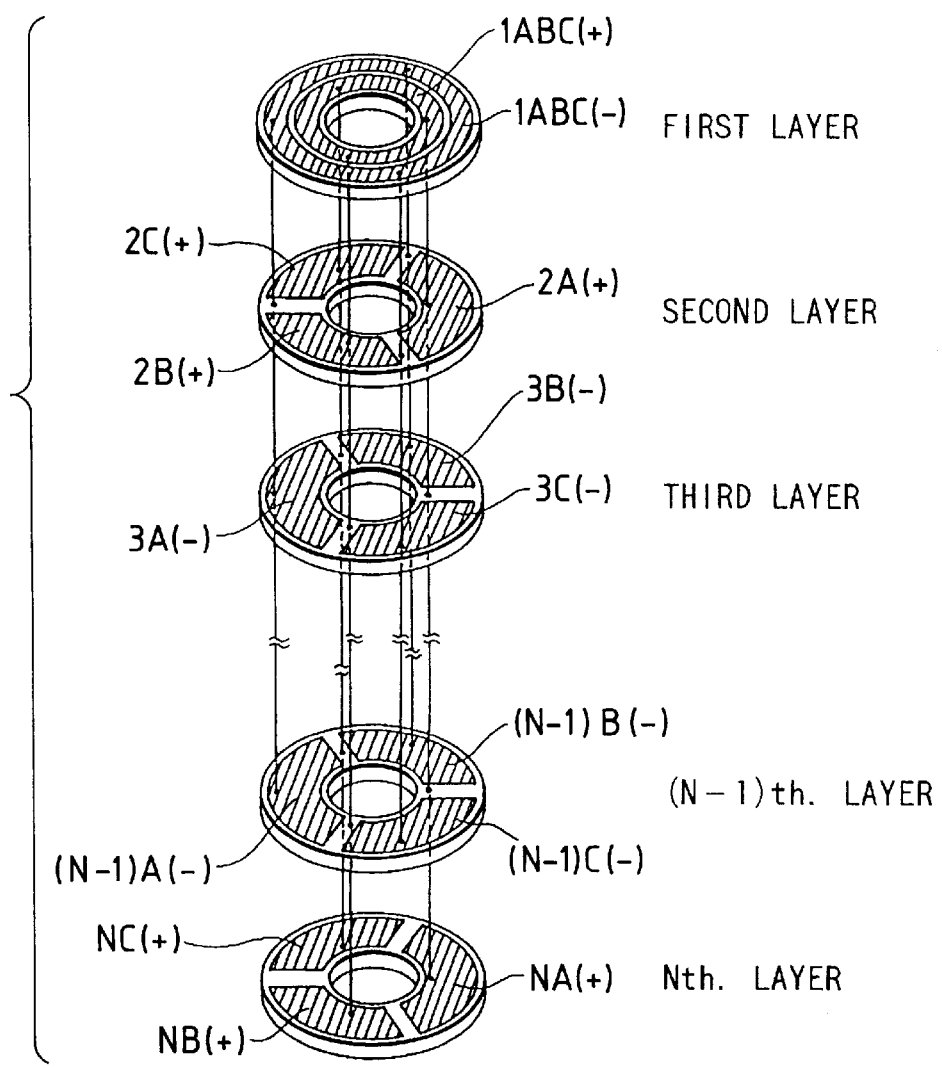
FIG. 8 is an exploded perspective view showing a stack type piezoelectric element according to the second embodiment of the present invention.

FIG. 8 shows the second embodiment of the present invention, through holes 2A1, 2B1, and 2C1 are formed near the inner circumference of a stack type piezoelectric element 3, and through holes 2A2, 2B2, and 2C2 are formed near the outer circumference. As the electrode pattern of the uppermost layer, two concentric ring-shaped electrodes 1ABC(+) and 1ABC(–) are formed.

Figure 9:
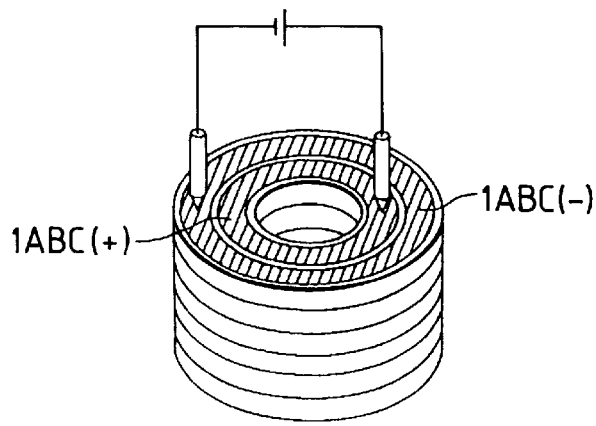
FIG. 9 is a perspective view showing a polarization method for the piezoelectric element in FIG. 8.

In this embodiment, as shown in FIG. 9, since a polarization process can be performed by only bringing two contact pins into contact with the respective pin electrodes, the circuit for a polarization process can be simplified. In addition, the number of contact pins to be used in this embodiment can be decreased as compared in the case shown in FIG. 2, i.e., from six to two. Furthermore, the contact pins need not be positioned in the rotational direction.

(Third Embodiment)

Figure 10:
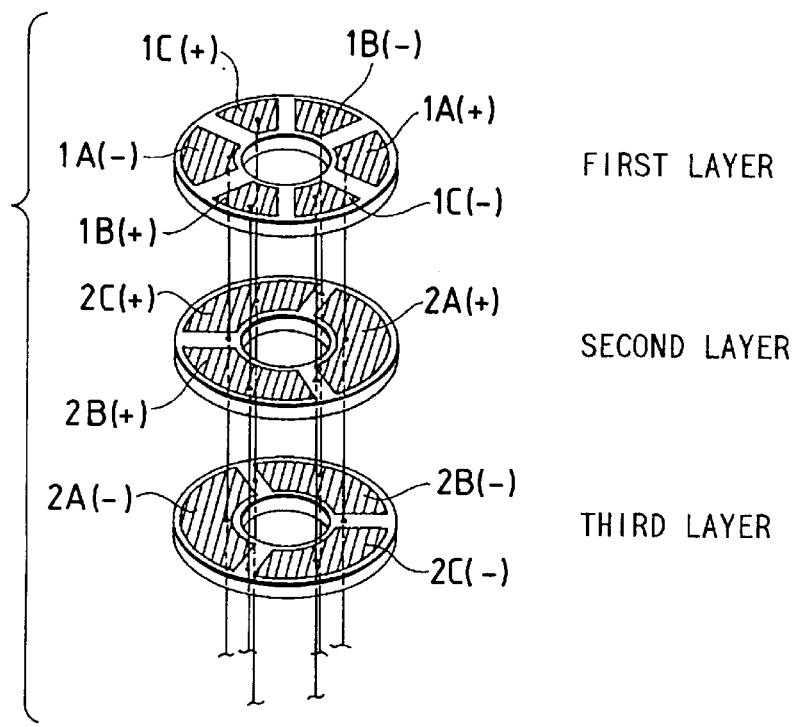
FIG. 10 is an exploded perspective view showing a stack type piezoelectric element according to the third embodiment of the present invention.
Figure 11A:
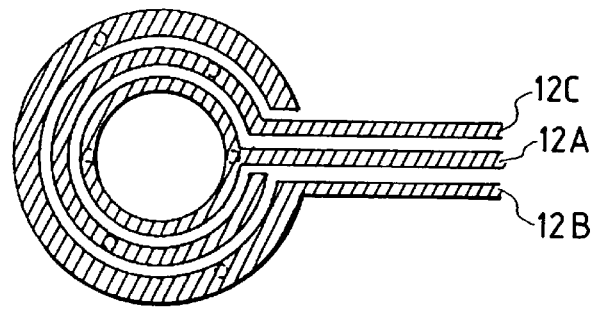
FIGS. 11A and 11B are plan views showing the positional relationship between the through holes in the stack type piezoelectric element of the third embodiment and the conductive portions of a flexible printed board.
Figure 11B:
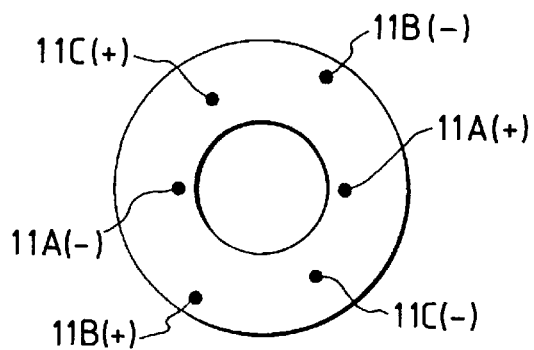
Figure 12:
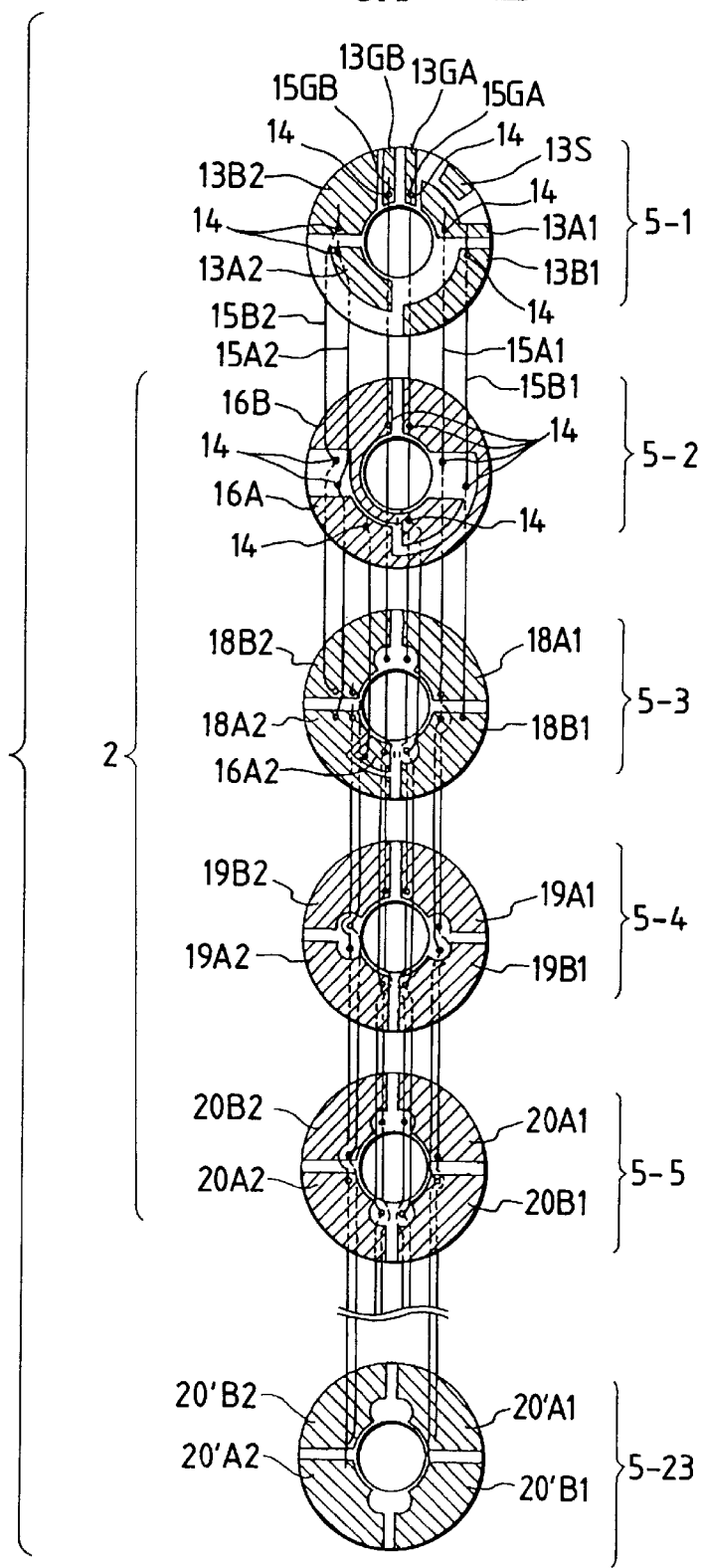
FIG. 12 is an exploded perspective view showing a previously proposed stack type piezoelectric element.

FIG. 10 shows the third embodiment of the present invention. In this embodiment, through holes 2A1 and 2A2 are formed near the inner circumference, through holes 2B1 and 2B2 are formed near the outer circumference, and through holes 2C1 and 2C2 are formed therebetween. In this case, as shown in FIGS. 11A and 11B, since a flexible printed board 12 has a simple concentric conductive pattern, the bending vibration natural frequency of the vibrator does not easily vary depending on the bending direction. In addition, relative positioning of the flexible printed board 12 and a stack type piezoelectric element 3 can be roughly performed in the rotational direction.

According to the above embodiment, since the piezoelectric element portions as the respective layers have the same polarity, a simple structure can be realized. Therefore, the ineffective portions of a piezoelectric member can be reduced, and the number of transistors required for the output portions of a driving circuit can be decreased. In addition, since a uniform polarization polarity is set in each layer of the stack type piezoelectric element, unnecessary distortion can be prevented.

Since the electrodes need not be notched to allow conductors to extend therethrough so as to connect the electrode films of the piezoelectric element plates stacked on each other, a reduction in the effective area of each electrode film can be prevented.

Since each electrode film is divided into three portions, the areas of the portions having no electrode films can be reduced to increase the areas of the effective portions. In addition, since each piezoelectric element portion is divided into three portions, and the phases of the divided portions of alternate layers are shifted relative to each other by 120°, connection conductors can be caused to extend through the insulated portion having no electrode films and formed upon division of each piezoelectric element portion. Therefore, the electrodes need not be notched to allow connection conductors to extend therethrough, unlike the prior art.

Since the polarization polarity of each piezoelectric element of the stack type piezoelectric element is uniformly positive or negative, the vibration mode includes no nodes. For this reason, unnecessary distortion of each piezoelectric element plate can be prevented.

By applying three-phase AC voltages having a phase difference of 120° to the three divided electrodes, the element can be driven at a voltage about ½ that in the conventional two-phase driving mode. That is, there is provided a low-power vibration wave motor in which the number of transistors required for the driving circuit output portions is only about 1.5 times that in the prior art.

For example, the rod-shaped vibration wave motor can be driven by feedback control without forming any special layer on a piezoelectric element portion having an electrode film for vibration detection.

In addition, connection to a circuit can be easily and reliably realized.

Furthermore, the degree of freedom in positioning the vibration wave motor and the driving circuit can be increased.

Moreover, a driven member can be efficiently driven by the vibration wave motor.

(Fourth Embodiment)

The fourth embodiment of the present invention will be described next.

Prior to a description of the fourth embodiment, a technique on which the fourth embodiment is based will be described with reference to FIGS. 30A to 33D. As shown in FIGS. 30A to 30F, a stack type piezoelectric element is constituted by a piezoelectric member (FIG. 30A) as the uppermost layer on which six divided electrode films 114A, 114B, 114AG, and 114BG are formed, and piezoelectric element members as the second and subsequent layers (FIGS. 30B to 30F) each having 12 electrode films 112A, 112B, 116A, 116B, 113A, and 113B formed in the circumferential direction at ¼-wavelength intervals. The second and subsequent piezoelectric elements are stacked so that the phases of the electrode films have the same phase.

Figure 31:
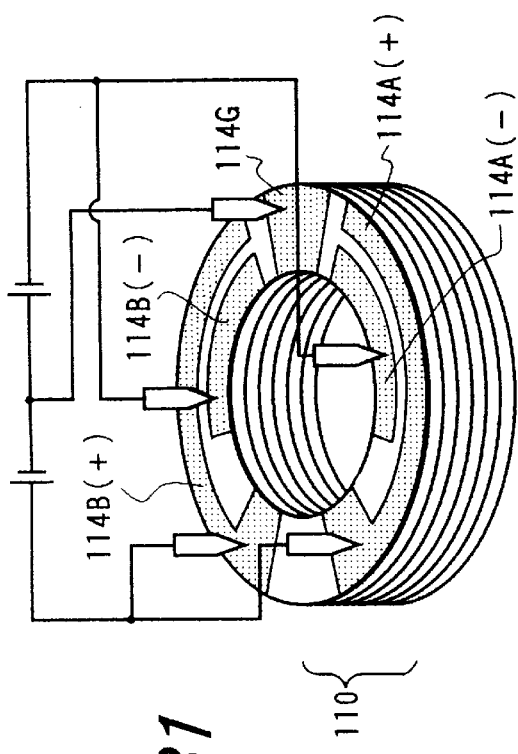
FIG. 31 is a perspective view showing how voltages are applied to perform a polarization process for the stack type piezoelectric element on which the present invention is based.
Figure 32:
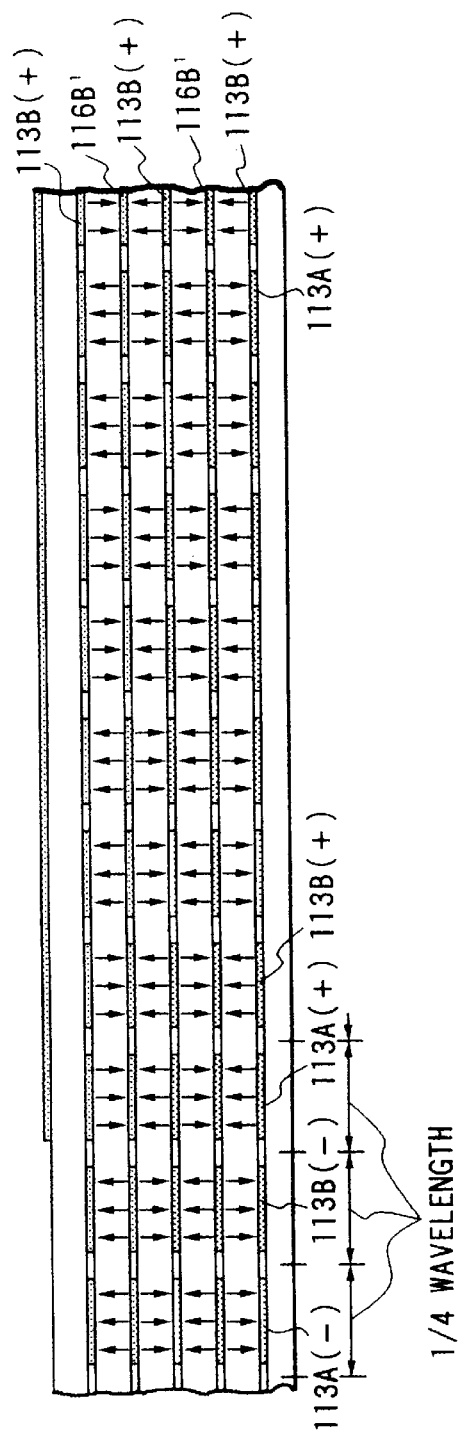
FIG. 32 is a developed sectional view showing the polarization polarities of the stack type piezoelectric element on which the present invention is based.

In the stack type piezoelectric element formed in this manner, the electrode films of the two layers stacked on each other with one layer being sandwiched therebetween are connected to each other via conductors inserted in through holes or the like formed in the sandwiched layer. In a polarization process, as shown in FIG. 31, an external electrode is connected to each electrode film on the uppermost layer, and a DC voltage is applied thereto in the positive or negative direction. With this process, as shown in FIG. 32, the piezoelectric member as each layer is polarized in accordance with the directions of electric fields between the upper and lower electrode films sandwiching the layer.

When a periodic voltage is applied to each electrode film on the uppermost layer, the stack type piezoelectric element vibrates to generate traveling vibration waves of an elastic member.

Figure 33A:
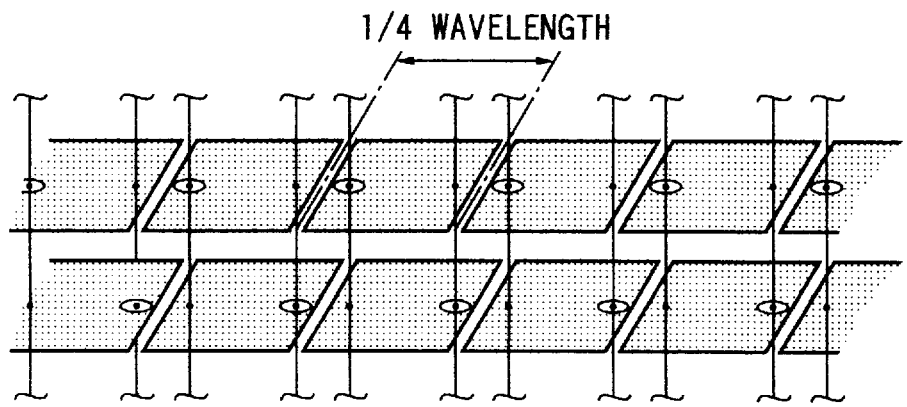
FIGS. 33A to 33D are views for explaining the relationship between through holes and the electrodes of the stack type piezoelectric element on which the present invention is based.
Figure 33B:
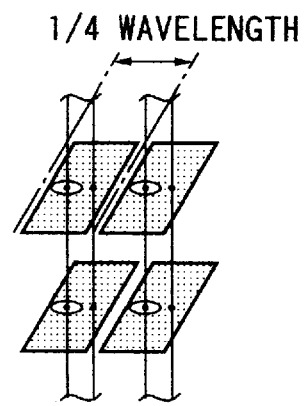

In the stack type piezoelectric element in FIGS. 30A to 30F, the electrode films on the second and subsequent layers have the same phase. For this reason, in order to cause conductors to extend through the piezoelectric members as the upper and lower layers sandwiching one layer so as to connect the electrode films of the piezoelectric members, the electrode films sandwiched between the layers are partly removed. As shown in FIG. 33B, when the periodic voltage has a short wavelength, and the area of one electrode film is small, the removed portions have a large area as compared with the electrode films, and the effective areas of the electrode films become small.

As shown in FIG. 31, when a stack type piezoelectric element is to be polarized, many external electrodes corresponding to the number of electrode films are required, and these external electrodes and electrode films must be positioned with high precision.

Figure 33C:
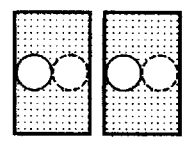
Figure 33D:
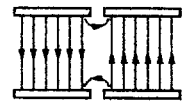

In addition, since the directions of electric fields applied to the adjacent electrode films on each layer are opposite (i.e., opposite polarization polarities), a region which is not polarized or polarized in the planar direction is formed at the boundary portion between the two electrode films, as shown in FIG. 33D. If such a stack type piezoelectric element is used for a driving device, these regions do not contribute to the driving operation of a contact member at all, or interfere therewith. That is, such a region may become a cause that degrades the effective use efficiency of the stack type piezoelectric element or the driving efficiency of the driving device.

Figure 14A:
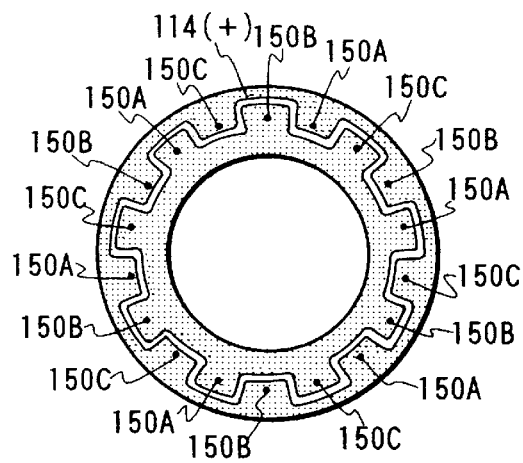
FIGS. 14A to 14F are views showing the electrode patterns on the layers of a stack type piezoelectric element according to the fourth embodiment of the present invention.

FIGS. 14A to 14F show the electrode patterns on the layers of a stack type piezoelectric element for an annular ultrasonic motor according to the fourth embodiment. FIG. 14A shows the electrode pattern on the first layer (uppermost layer). Through holes 150A, 150B, and 150C serve to vertically connect the electrodes on the alternate layers to each other. An electrode 114(+) is formed on the outer circumference side of the first layer to connect all the electrodes on even-numbered layers (i.e., electrodes 112A(+), 112B(+), and 112C(+)). Similarly, an electrode 114(−) is formed on the inner circumference side of the first layer to connect all the electrodes on even-numbered layers (i.e., electrodes 112A(−), 112B(−), and 112C(−)).

Figure 14B:
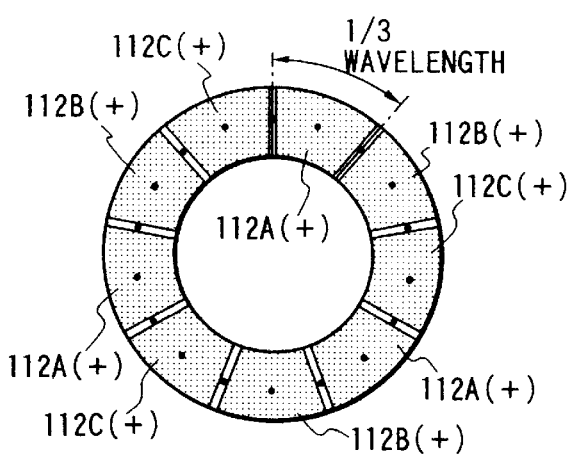

FIG. 14B shows the electrode pattern on the second layer. In this embodiment, the annular ultrasonic motor is driven in the tertiary (i.e., the wave number of a traveling wave is 3) mode. Each electrode on the second layer has a ⅓ wavelength, i.e., about 40 deg., and nine electrodes are arranged at equal intervals in the circumferential direction. The dots in the center of each electrode and on the boundary portions between the electrodes are the through holes 150A, 150B, and 150C in FIG. 14A.

Figure 14C:
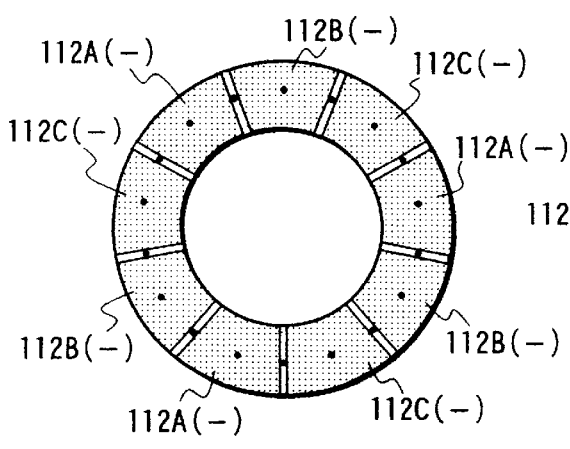
Figure 14D:
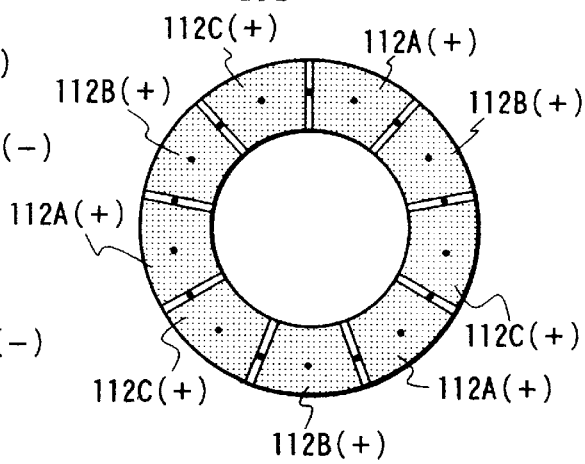
Figure 14E:
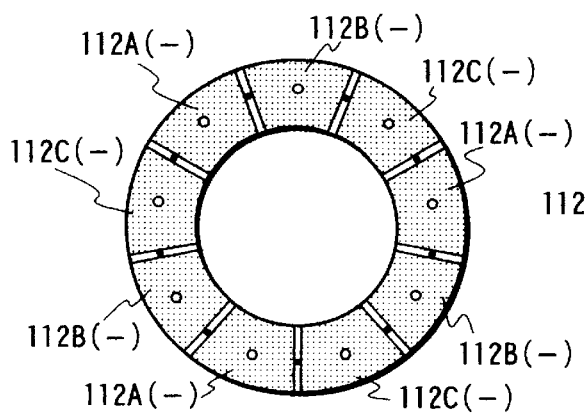
Figure 14F:
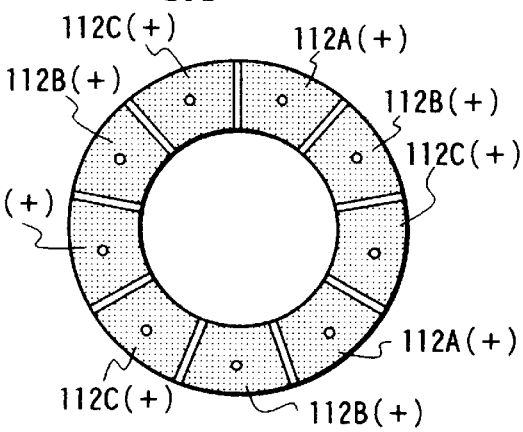

FIG. 14C shows the electrode pattern on the third layer. Although the shape of each electrode on the third layer is the same as that on the second layer, the phase of each electrode differs from that on the second layer by 20 deg (i.e., ⅙ wavelength). FIG. 14D shows the electrode pattern on the fourth layer. This fourth layer is formed to have the same pattern as that of the second layer. FIG. 14E shows the electrode pattern on the fifth layer. The fifth layer is formed to have the same pattern as that of the third layer. FIG. 14F shows the sixth layer, i.e., the lowermost layer. The white circles in FIGS. 14E and 14F indicate the end portions of the through holes 150A, 150B, and 150C.

The stack type piezoelectric element of this embodiment is formed stacking/pressing six piezoelectric members, obtained by printing the electrode pattern shown in FIGS. 14A to 14F on piezoelectric material sheets, and sintering the resultant structure.

Figure 16:
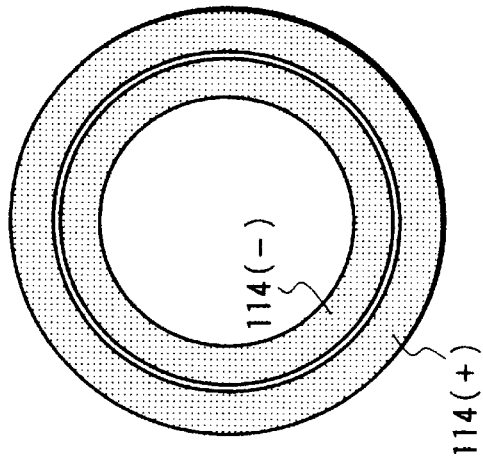
FIG. 16 is a view showing a first layer electrode pattern in which through holes are formed near the inner and outer circumferences, respectively.
Figure 15:
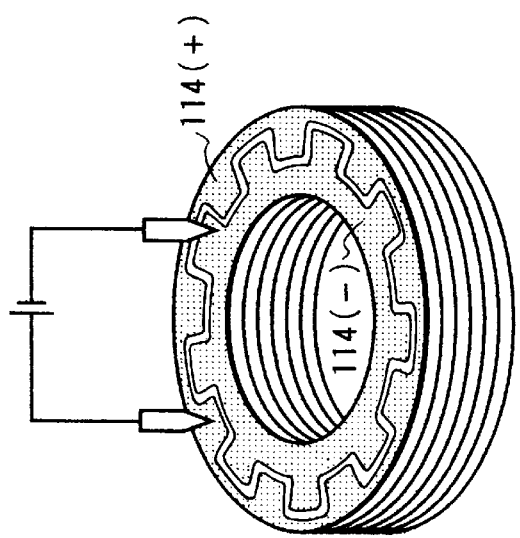
FIG. 15 is a perspective view showing a stack type piezoelectric element after pressing and sintering processes, and a voltage to be applied in a polarization process.

FIG. 15 shows a voltage application method used when a stack type piezoelectric element formed in this manner is to be polarized. Positive and negative potentials are respectively applied to electrodes 114(+) and 114(−) by using external electrodes. Since only the two external electrodes are used, the arrangement of an electrode circuit for polarization becomes simpler than that shown in FIG. 31. In addition, a polarization process can be easily performed because, for example, the positioning precision for the external electrodes is not very high. If through holes 150A, 150B, and 150C are alternately formed near the outer and inner circumference sides of the first layer in the circumferential direction, as shown in FIG. 16, since electrodes 114(+) and 114(−) on the first layer constitute a simple, concentric ring-shaped pattern, the external electrodes need not be positioned in the circumferential direction in a polarization process. The polarization process can therefore be further facilitated.

Figure 17:
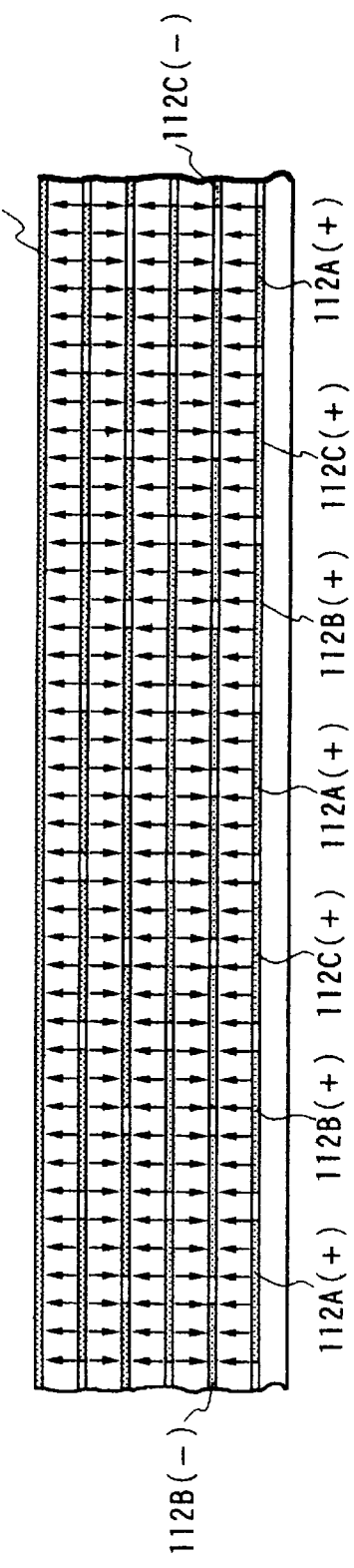
FIG. 17 is a developed sectional view showing polarization polarities in the respective layers.

FIG. 17 is a development of residual polarization polarities after a polarization process. A negative potential is applied to the electrode 114(−) of the first layer, and a positive potential is applied to all the electrodes 112A(+), 112B(+), and 112C(+) of the second layer. The entire piezoelectric member as the first layer is polarized to the same polarity (indicated by the arrows pointing upward). Since a negative potential is applied to all the electrodes 112A(−), 112B(−), and 112C(−) of the second layer, the entire piezoelectric member as the second layer is polarized to the same polarity (indicated by the arrows pointing downward), which is opposite to the polarity of the first layer. The subsequent layers are polarized in the same manner as described above. As a result, the piezoelectric members polarized to the opposite polarities are alternately stacked on each other. Note that the piezoelectric member as the sixth layer is not polarized because no electrodes are formed thereunder.

FIGS. 18A to 18D show an electrode structure. The difference between this structure and the electrode structure shown in FIGS. 33A to 33D, on which the present invention is based, will be described below with reference to FIGS. 18A to 18D and 33A to 33D.

Figure 18A:
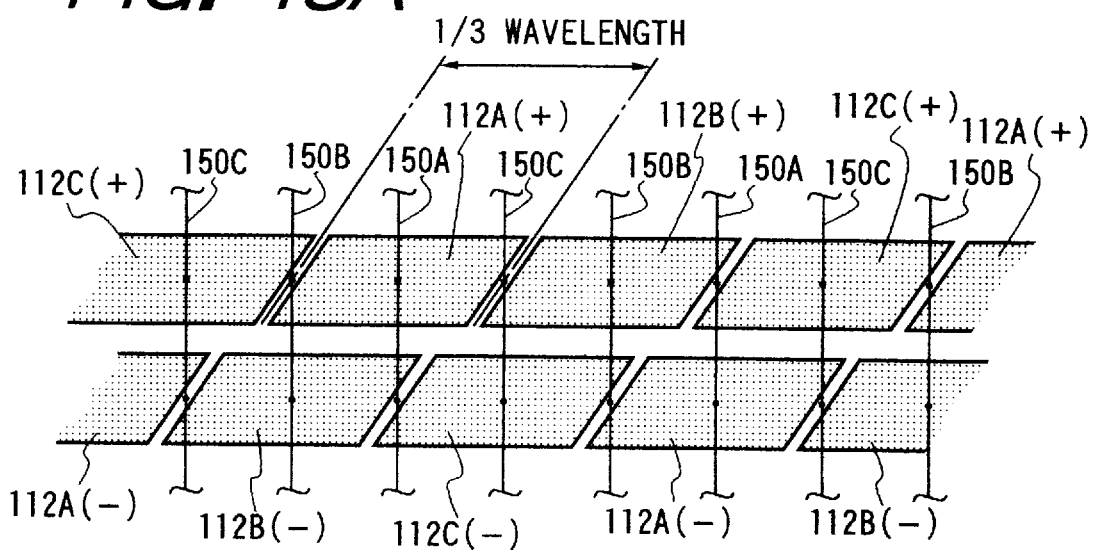
FIGS. 18A to 18D are views for explaining the positional relationship between electrodes and through holes.
Figure 18B:
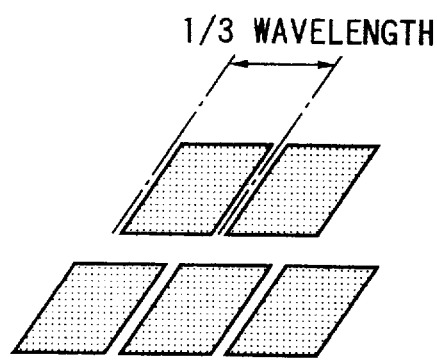
Figure 18C:
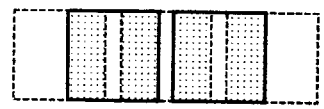
Figure 18D:

FIG. 18A shows the positions of electrodes three-dimensionally when the electrode structure of the stack type piezoelectric element of this embodiment is viewed obliquely. As is apparent from FIG. 18A, electrodes, each having a length corresponding to ⅓ wavelength, are arranged at predetermined width intervals in the circumferential direction of the piezoelectric member (the lateral direction in FIG. 18A). Since the phases of the electrodes on the upper and lower layers are shifted from each other, each of through holes 150A, 150B, and 150C for connecting the electrodes on the upper layer to those on the third layer can extend through the portion (to be referred to as the boundary portion hereinafter) between two electrodes on the second layer (the lower layer in FIG. 18A). Referring to FIG. 33A, since the electrodes on the upper and lower layers overlap perfectly, in order to cause through holes to extend through the upper and lower layers, holes must be formed in the electrodes on the second layer to allow the through holes to extend therethrough. In designing a compact ultrasonic motor, in particular, with a decrease in wavelength, the ratio of the area of each hole allowing a through hole to extend therethrough increases, and the ratio of the effective area of each electrode decreases, as shown in FIG. 33B. As shown in FIG. 33C, which is a projection of the electrodes in FIG. 33B viewed from above, the portions where the upper and lower electrodes do not overlap each other because the holes continue in the circumferential direction. For this reason, polarization may not be properly performed at these portions. As shown in FIG. 18C, the piezoelectric element also has portions where the upper and lower electrodes do not overlap. However, as shown in FIG. 18D, an electrode film is always present above or below such a portion of each layer, and each layer is polarized to the same polarity, each boundary portion between the electrodes is polarized to almost the same degree as that of the remaining portions owing to roundabout entrance of an electric field. If, therefore, the piezoelectric element is used as a vibrator, the polarized boundary portions serve as effective portions.

FIG. 33D shows a portion around the boundary portion between electrodes of the piezoelectric element on which the present invention is based. As is apparent from FIG. 33D, since opposite polarization polarities are set in the layer, there is a portion which is not polarized at all or a portion which is polarized in a direction along the surface (planar direction).

Figure 19:
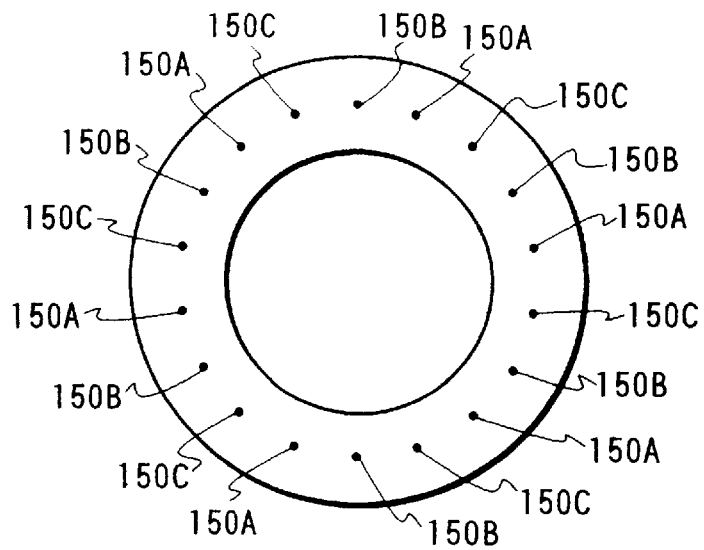
FIG. 19 is a plan view showing the piezoelectric member as the uppermost layer from which electrode films have been removed.

FIG. 19 shows the stack type piezoelectric element, viewed from the first layer side, from which the electrodes 114(+) and 114(−) of the first layer have been removed after a polarization process. As is apparent from FIG. 19, end portions of the through holes 150A, 150B, and 150C are exposed.

Figure 20A:
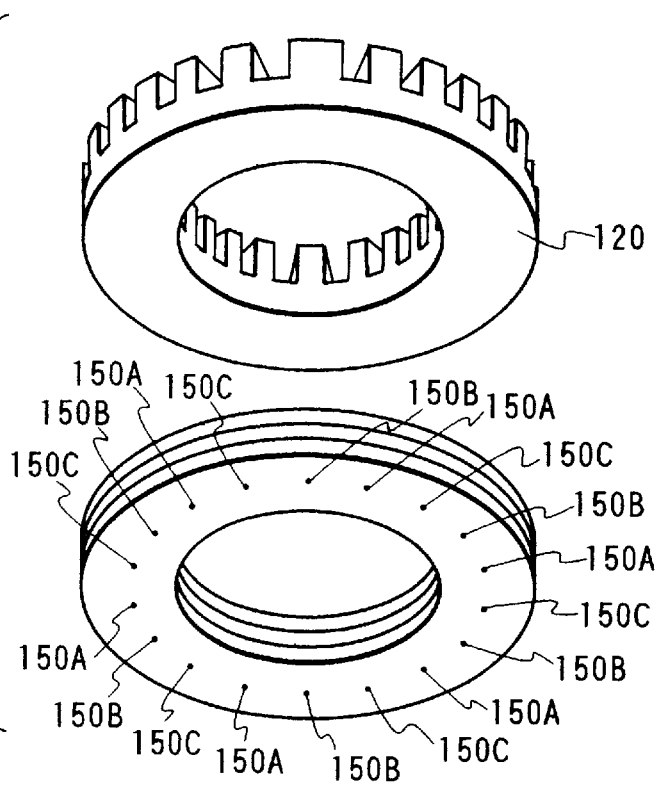
FIGS. 20A and 20B are views showing the parts of the vibrator of an annual ultrasonic motor.
Figure 20B:
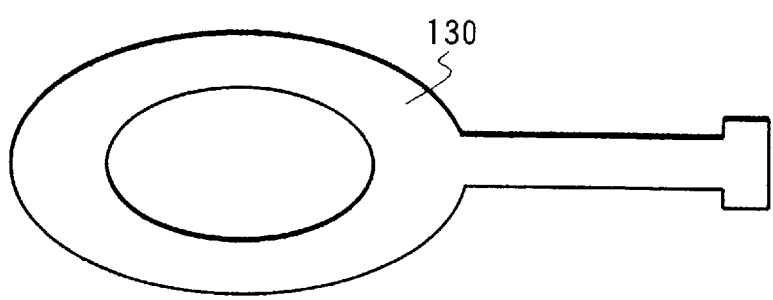

FIGS. 20A and 20B show a parts of a vibrator of an annular vibration motor using this stack type piezoelectric element. An elastic metal member 120 has many projections. The lowermost layer (the sixth layer in this embodiment) of the stack type piezoelectric element is joined to the bottom surface of elastic member 120. A flexible printed board 130 is joined (bonded or soldered) to the upper surface of the first layer of the stack type piezoelectric element. A driving circuit (to be described later) is connected to this flexible printed board 130.

Figure 21:
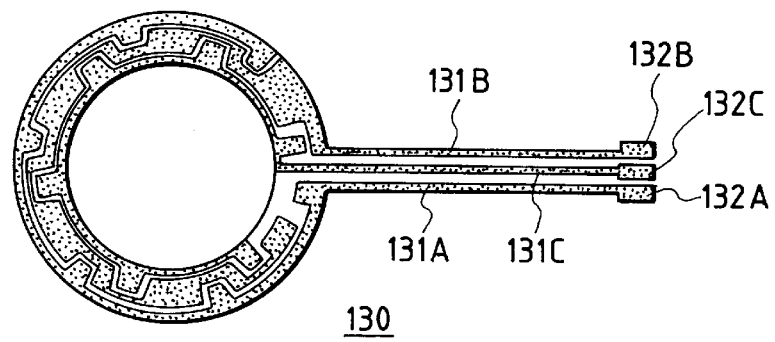
FIG. 21 is a view showing the conductive patterns on a flexible printed board for supplying power to a stack type piezoelectric element.

FIG. 21 shows the conductive patterns on the flexible printed board 130 in this case. A pattern 131A is connected to every third through hole 150A of the through holes of the stack type piezoelectric element, and receives power via a terminal 132A. Similarly, a patter 131B is connected to all through holes 150B, and receives power via a terminal 132B. A pattern 131C is connected to all through holes 150C, and receives power via a terminal 132C.

Figure 22A:
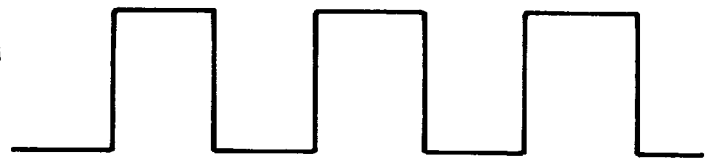
FIGS. 22A to 22C are timing charts showing AC voltages for driving an ultrasonic motor.
Figure 22B:
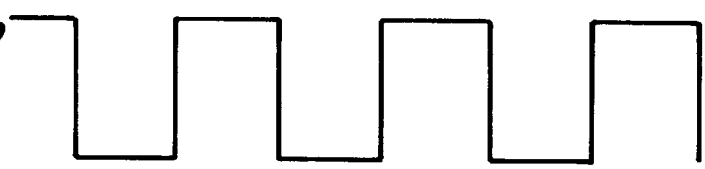
Figure 22C:
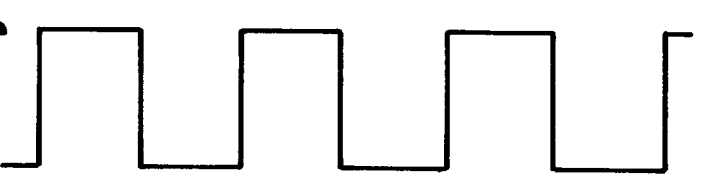

FIGS. 22A to 22C show AC voltages to be applied to these terminals 132A, 132B, and 132C (the abscissa representing time t). The AC voltages (periodic voltages) are three-phase AC voltages having a phase difference of 120°. The applied voltages in FIGS. 22A to 22C are rectangular waves. However, they may be sine waves. In addition, as is known, each voltage has a frequency near the bending natural frequency (the tertiary mode in this case) of the vibrator of the vibration wave motor.

In this manner, electric fields $V_a-V_b$, $V_b-V_c$, and $V_c-V_a$ are applied between the electrodes of the piezoelectric element to produce traveling vibration waves which rotate in one circumferential direction of the piezoelectric element and the elastic members. When the rotation of the vibration waves is to be reversed, the phases of the applied voltages may be switched.

Figure 23:
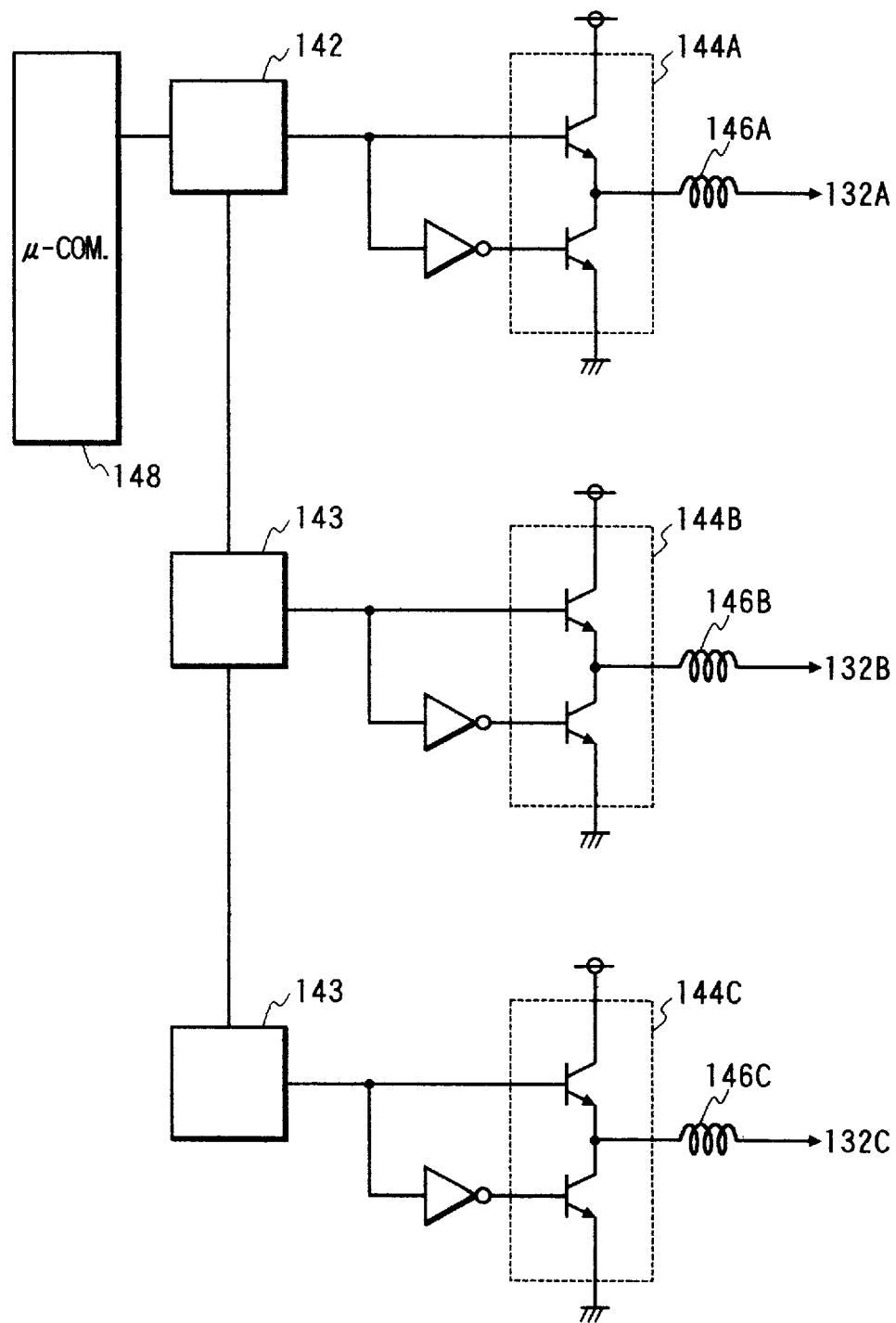
FIG. 23 is a circuit diagram showing a circuit for driving the ultrasonic motor.
Figure 24A:
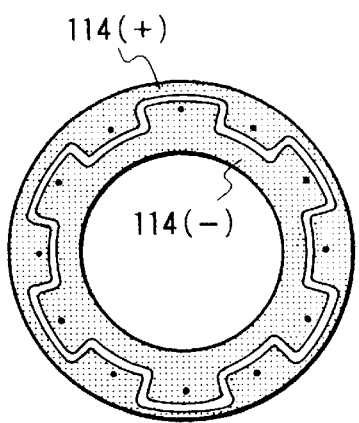
FIGS. 24A to 24F are views showing the electrode patterns of the layers of a stack type piezoelectric element according to the fifth embodiment of the present invention.
Figure 24B:
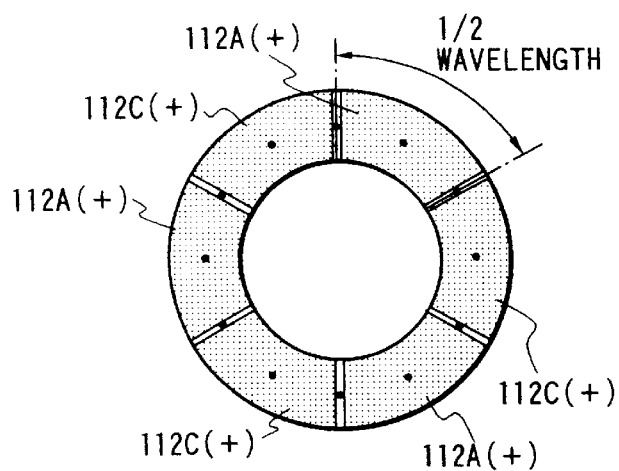
Figure 24C:
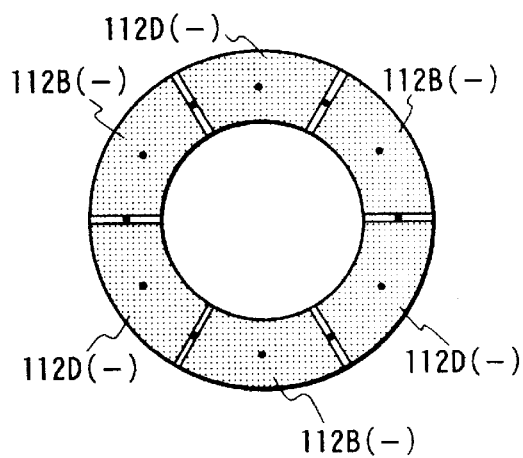
Figure 24D:
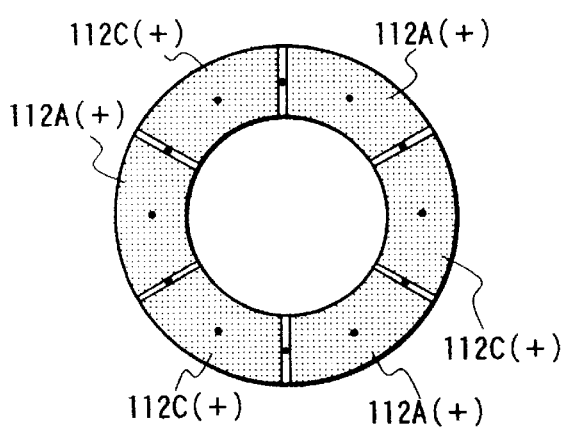
Figure 24E:
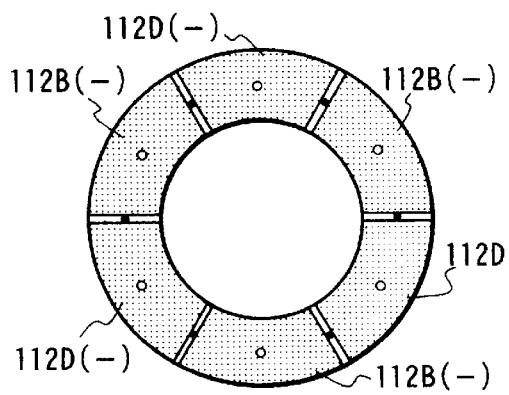
Figure 24F:
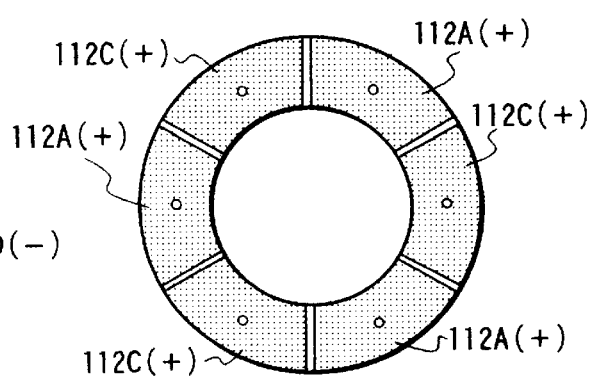

FIG. 23 shows a driving circuit. Referring to FIG. 23, this circuit includes a microcomputer (μ-com.) 148 for control operations, a 120°/−120° phase shifter 143, switching circuits 144A, 144B, and 144C, and coils 146A, 146B, and 146C for amplifying switched pulse voltages.

(Fifth Embodiment)

FIGS. 24A to 24D show the electrode patterns on the layers of a stack type piezoelectric element according to the fifth embodiment of the present invention. The fifth embodiment is different from the fourth embodiment in that each of the second and subsequent layers has a length corresponding to ½ wavelength. In this case, the AC voltages to be applied are four-phase AC voltages whose phases are shifted from each other by 90 deg., as shown in FIGS. 25A to 25D.

That is, electric fields $V_a-V_b$, $V_b-V_c$, $V_c-V_d$, and $V_d-V_a$ are applied between the electrodes of the piezoelectric element (Sixth Embodiment)

Figure 26:
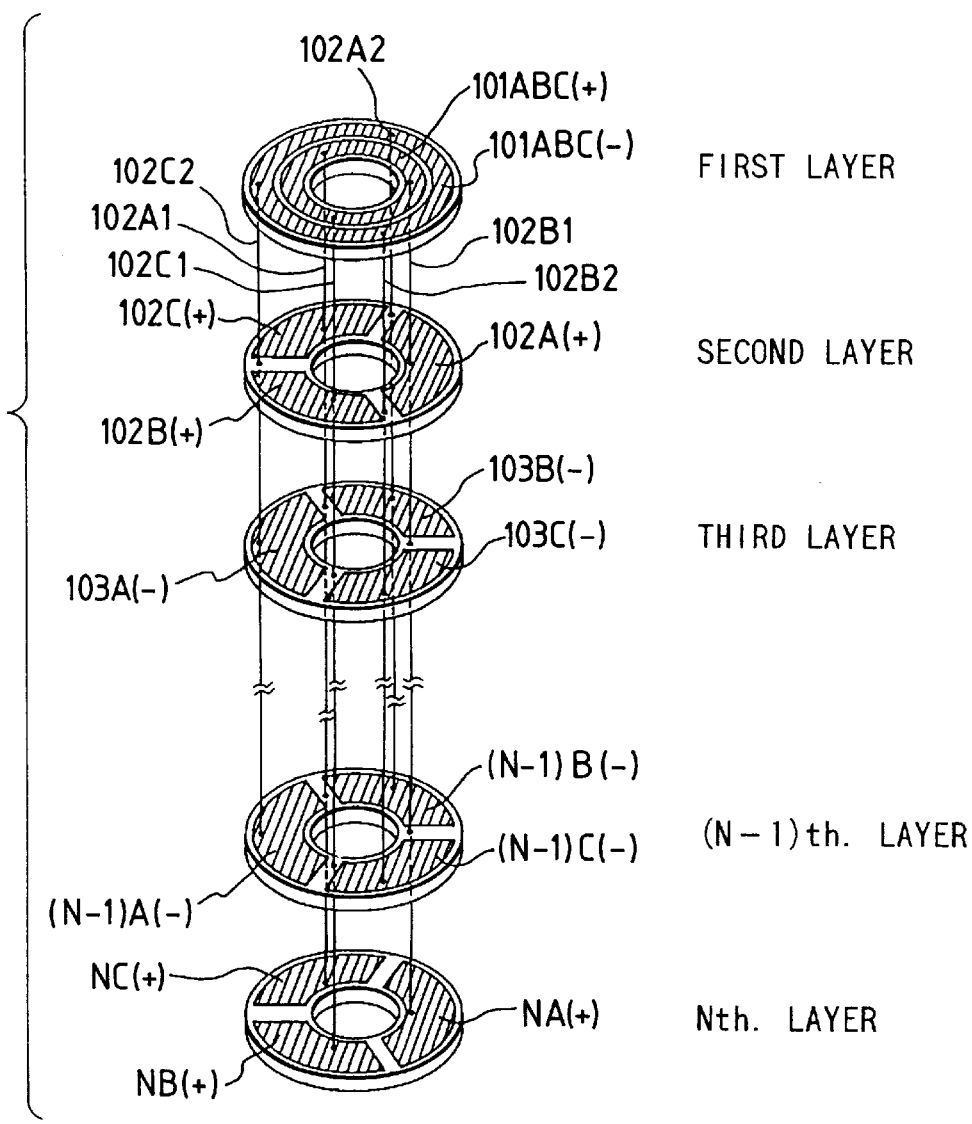
FIG. 26 is an exploded perspective view showing the electrode patterns of the layers of a stack type piezoelectric element according to the sixth embodiment of the present invention.

FIG. 26 shows the sixth embodiment of the present invention. A stack type piezoelectric element of this embodiment is formed by stacking N piezoelectric members. Three electrode films divided into the circumferential direction are formed on the upper surface of each of the layers except for the uppermost layer (first layer), and the piezoelectric members as the odd- and even-numbered layers are stacked on each other such that the phases of the electrode films are shifted from each other by 120°. Two concentric, annular electrode films 101ABC(+) and 101ABC(−) are formed on the upper surface of the piezoelectric member as the uppermost layer. Each piezoelectric member is polarized to the same polarity, and the odd- and even-numbered layers are polarized to the opposite polarities.

Six through holes 102A1, 102A2, 102B1, 102B2, 102C1, and 102C2 are formed in each of the piezoelectric members except for the piezoelectric member as the lowermost layer at equal intervals in the circumferential direction. The through holes 102A1, 102B1, and 102C1 extending to the electrode film 101ABC(+) are formed near the inner circumference, and the through holes 102A2, 102B2, and 102C2 extending to the electrode film 101ABC(−) are formed near the outer circumference.

Three electrode films 102A(+), 102B(+), and 102C(+) divided in the above manner are formed on the piezoelectric member as the second layer, and the through holes 102A1, 102B1, and 102C1 extend to these electrode films. The remaining through holes 102A2, 102B2, and 102C2 extend through the boundary portions between the electrode films 102A(+), 102B(+), and 102C(+), and are insulated therefrom.

Three electrode films 103A(−), 103B(−), and 103C(−) divided in the above manner are formed on the piezoelectric member as the third layer, and the phase of each of these electrode films is shifted from a corresponding one of those on the second layer by 180°. The through holes 102A2, 102B2, and 102C2 extend to the electrode films 103A(−), 103B(−), and 103C(−). Note that the remaining through holes 102A1, 102B1, and 102C1 extend through the boundary portions between the electrode films 103A(−), 103B(−), and 103C(−), and are insulated therefrom.

Each of the even-numbered layers, e.g., the fourth, sixth, and eighth layers, has the same structure as that of the second layer, and the through holes 102A1, 102B1, and 102C1 extend to the electrode films on these even-numbered layers.

Each of the odd-numbered layers, e.g., the fifth and seventh layers, has the same structure as that of the third layer, and the through holes 102A2, 102B2, and 102C2 extend to the electrode films on these odd-numbered layers.

Figure 27:
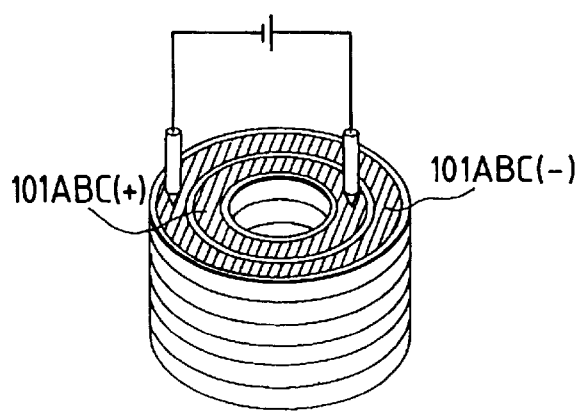
FIG. 27 is a perspective view showing the state of the stack type piezoelectric element of the sixth embodiment after pressing and sintering processes, and a voltage to be applied in a polarization process.

As shown in FIG. 27, in the stack type piezoelectric element formed in this manner as well, each layer can be easily polarized by only connecting two external electrodes to the electrodes on the uppermost layer. After the polarization process, the electrodes 101ABC(+) and 101ABC(−) are removed from the first layer, and the resultant structure is sandwiched between elastic members together with a flexible printed board (not shown), thus obtaining a rod-shaped vibrator.

(Seventh Embodiment)

Figure 28:
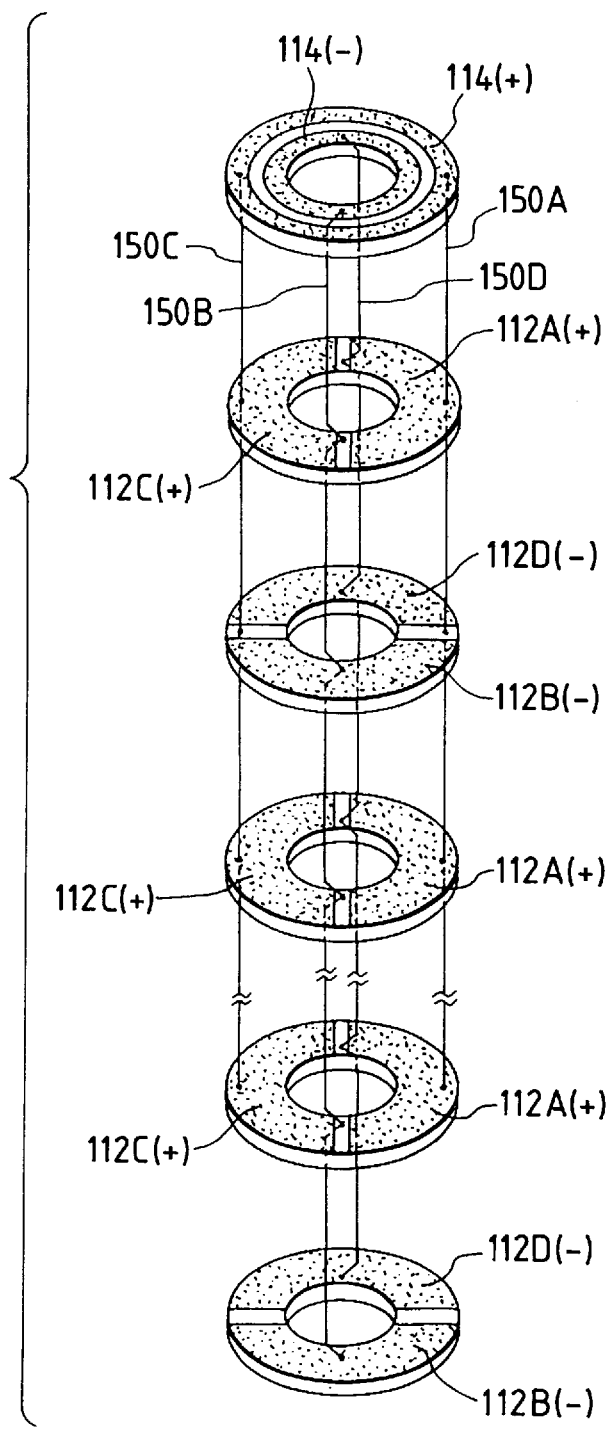
FIG. 28 is an exploded perspective view showing the electrode patterns of the layers of a stack type piezoelectric element according to the seventh embodiment of the present invention.

FIG. 28 shows the electrode patterns on the layers of a stack type piezoelectric element as the seventh embodiment of the present invention in a case wherein the piezoelectric element is applied to a rod-shaped vibration wave motor. Similar to the fourth to sixth embodiments, in this stack type piezoelectric element, after a plurality of piezoelectric members are stacked/pressed and sintered, a polarization process is performed by applying a voltage between electrodes 114(+) and 114(−). After the polarization process, the electrodes 114(+) and 114(−) are removed from the first layer, and the resultant structure is sandwiched between elastic members together with a flexible printed board, thus obtaining a rod-shaped vibration member.

In this embodiment, the voltages to be applied in a driving operation have a phase relationship like the one shown in FIGS. 25A to 25D. More specifically, when four-phase AC voltages $V_a$, $V_b$, $V_c$, and $V_d$ having a phase difference of 90° are applied to through holes 150A, 150B, 150C, and 150D via the flexible printed board, an electric field $V_a-V_b$ is applied between electrodes 112A(+) and 112B(−); an electric field $V_b-V_c$, between electrodes 112B(−) and 112C(+); an electric field $V_c-V_d$, between electrodes 112C(+) and 112D(−); and an electric field $V_d-V_a$, between electrodes 112D(−) and 112A(+).

Figure 29:
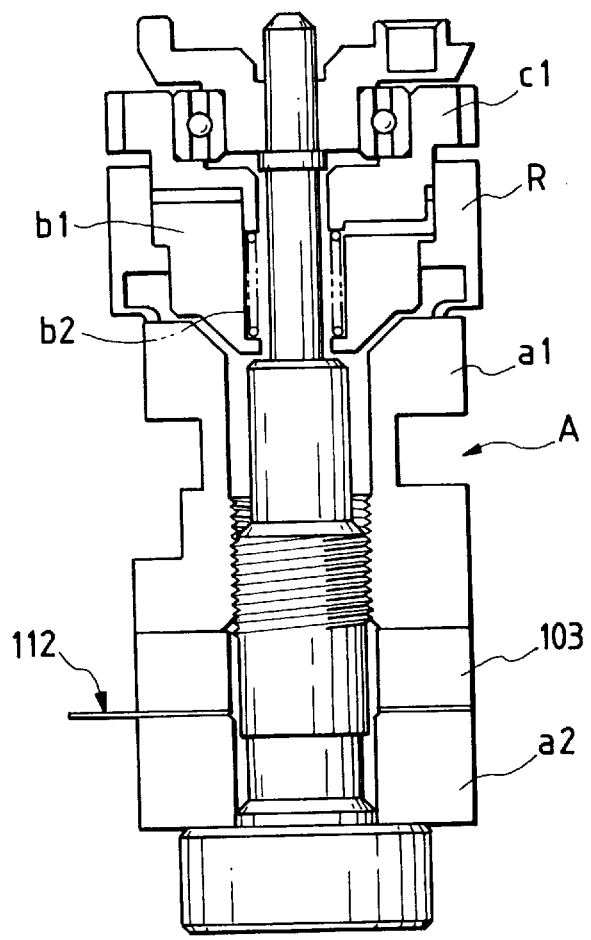
FIG. 29 is a sectional view showing a rod-shaped vibration wave motor using the stack type piezoelectric element of the seventh embodiment.
Figure 30A:
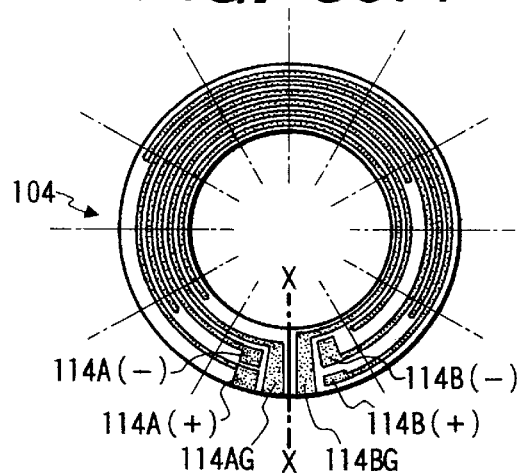
FIGS. 30A to 30F are views showing the electrode patterns of the layers of a stack type piezoelectric element on which the present invention is based.
Figure 30B:
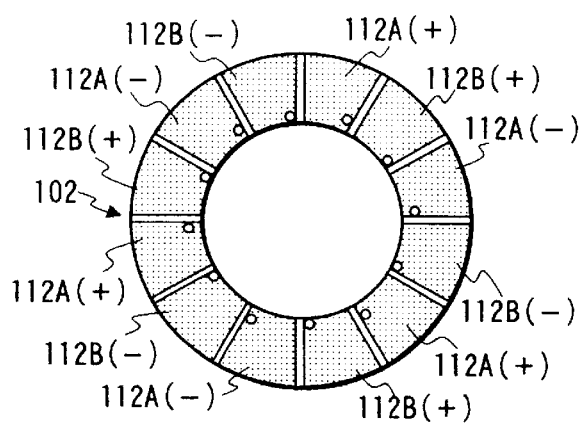
Figure 30C:
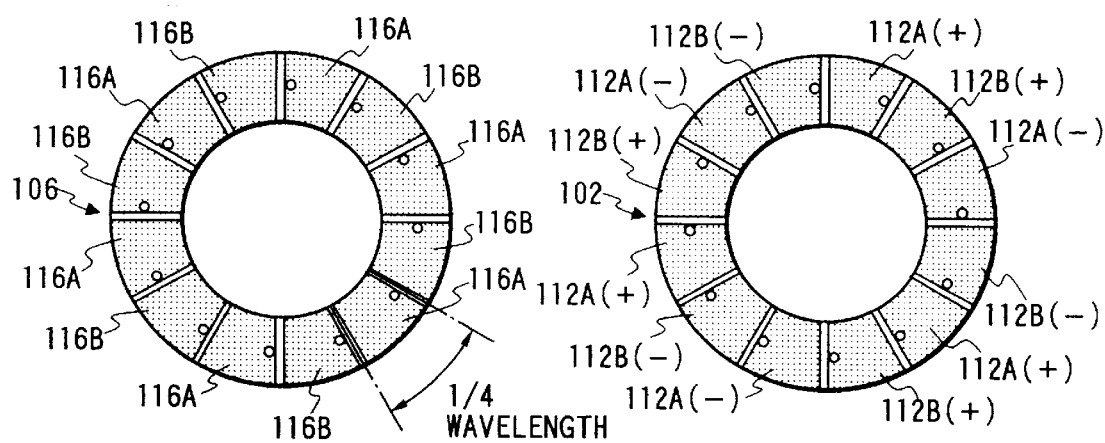
Figure 30D:
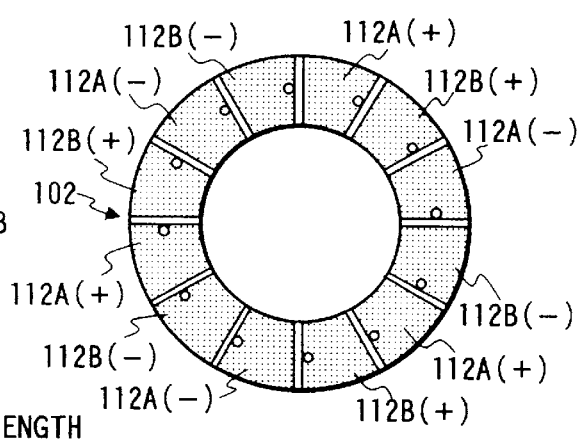
Figure 30E:
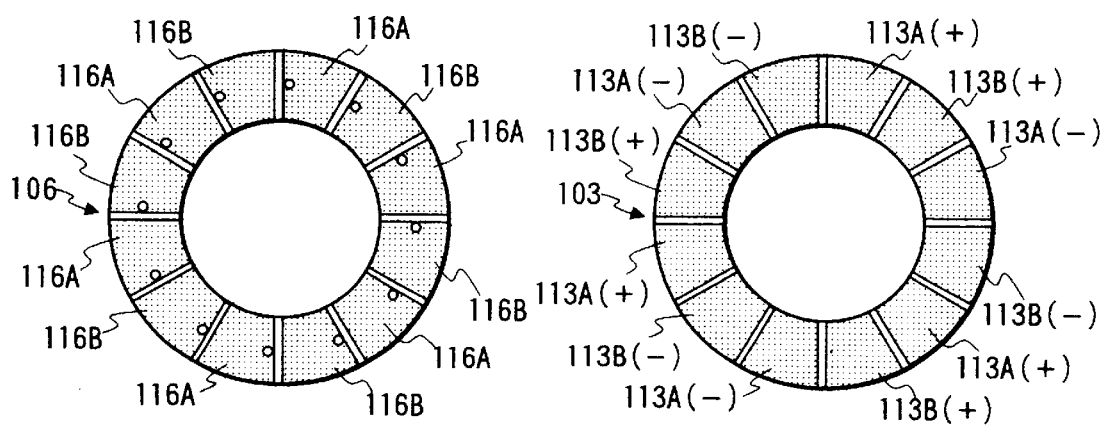
Figure 30F:
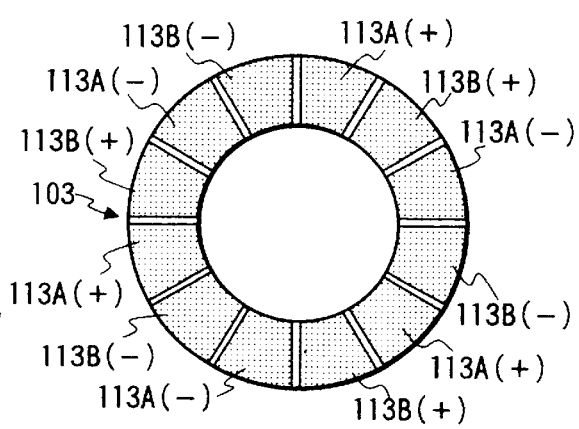

A stack type piezoelectric element 103 is clamped, as the driving portion of a vibrator A of the rod-shaped vibration wave motor in FIG. 29, between elastic vibration members a1 and a2, and is fixed therebetween by fastening the elastic vibration members a1 and a2 with a bolt. In this case, the conductive pattern on a flexible printed board 112 is brought into tight contact with the surface of the uppermost layer in FIG. 28 from which the electrodes 114(+) and 114(−) are removed.

In this rod-shaped ultrasonic motor, when AC voltages are applied from a driving circuit (not shown) to the piezoelectric element 103, elliptic motions are excited on the end face of the elastic vibration member a1. The flange shaped spring of a rotor R as a moving object (contact member) is pressed against the end face, of the elastic vibration member a1. This pressing force is given by a compression spring b2 via a spring bearing member b1. The rotor R is frictionally driven by elliptic motions-produced on the elastic vibration member a1 of the vibrator A. The resultant rotational force is transferred to an output member c1 meshed with the rotor R.

The fourth to seventh embodiments described above exemplify the three-phase driving mode (the fourth and sixth embodiments) and the four-phase driving mode (the fifth and seventh embodiments). However, the present invention is not limited to these modes. For example, the present invention can be applied to modes with larger numbers of phases, e.g., the five-phase driving mode and the six-phase driving mode. If, however, the number of phases increases, smaller electrode patterns are required, or larger output portions of the driving circuit are required, resulting in disadvantages in terms of cost and size. That is, the three- and four-phase driving modes are most suitable for low-cost, compact structures.

The above embodiments, modifications, and their technical factors of the present invention may be combined, as needed.

As has been described above, in the first to seventh embodiments, since each layer is polarized to the same polarity, polarization can be prevented from occurring in the boundary portion between two adjacent electrode films on each layer in the planar direction. In addition, since the phases of the electrode films on the respective layers are shifted in the planar direction, the electrode films on each layer can be located on the rear surface side of the boundary portions between the electrode films on the corresponding adjacent layer. Therefore, electric fields for polarization can be caused to detour to the boundary portions, and each boundary portion can be polarized to the same polarity as that of the layer in which the boundary portion is included.

In addition, the electrode films on the two layers stacked on each other through one piezoelectric member are connected to each other via conductors extending through the boundary portions between the electrode films on this piezoelectric member. For this reason, the electrode films need not be cut to allow the conductors to extend therethrough. A reduction in the effective area of each electrode film can therefore be prevented.

Furthermore, each piezoelectric member is polarized first through the electrode films formed on the piezoelectric member as the outermost layer, and the electrode films are then removed from the piezoelectric member as the outermost layer, thereby forming a stack type piezoelectric element. With this structure, a polarization process can be easily performed by only forming two electrode films serving as positive and negative poles on the piezoelectric member as the outermost layer, and connecting two external electrodes to these electrode films. When the above two electrode films are removed from the piezoelectric member as the outermost layer, and a printed wiring board or the like is joined to the resultant structure, periodic voltages for driving the stack type piezoelectric can be applied thereto via the printed wiring board.

If a vibration device using the above stack type piezoelectric element is formed, and this device is used, as a driving source, for a driving system, since the boundary portions between the electrode films can be properly polarized and serve to generate vibrations effective for a driving operation, the driving efficiency of the driving system can be improved.

what is claimed is:

1. A stack type energy conversion element comprising:
   a first electro-mechanical energy conversion element having a plurality of driving electrodes as a first group, all areas of said first electro-mechanical energy conversion element corresponding to said plurality of driving electrodes being polarized in a first direction; and
   a second electro-mechanical energy conversion element having a plurality of driving electrodes as a second group, all areas of said second electro-mechanical energy conversion element corresponding to said plurality of driving electrodes being polarized in a second direction inverse to the first direction,
   said first and second electro-mechanical energy conversion elements being stacked such that phases of said plurality of driving electrodes of said first group are shifted relative to phases of said plurality of driving electrodes of said second group.

2. A stack type element according to claim 1, wherein the number and pitch of said plurality of driving electrodes of said first group are equal to the number and pitch of said plurality of driving electrodes of said second group.

3. A stack type element according to claim 1, further comprising a third electro-mechanical energy conversion element having a plurality of driving electrodes as a third group, all areas of said third electro-mechanical energy conversion element corresponding to said plurality of driving electrodes being polarized in the first direction, said second electro-mechanical energy conversion element being stacked between said first and third electro-mechanical energy conversion elements such that phases of said plurality of driving electrodes of said third group coincide with phases of said plurality of driving electrodes of said first group.

4. A stack type element according to claim 3, wherein the number and pitch of said plurality of driving electrodes of said first group are equal to the number and pitch of said plurality of driving electrodes of said third group.

5. A stack type element according to claim 3, wherein specific driving electrodes of said plurality of driving electrodes of said first group and said plurality of driving electrodes of said third group which are in phase are electrically connected to each other via respective conductors formed in respective through holes, such that each conductor is not electrically connected to said plurality of driving electrodes of said second group.

6. A stack type element according to claim 5, wherein each through hole is located between adjacent electrodes of said plurality of driving electrodes of said second group.

7. A stack type element according to claim 5, further comprising a signal supplying element stacked on said first, second, and third electro-mechanical energy conversion elements, said signal supplying element being disposed at an exposed surface position, and having a plurality of signal supplying electrodes, respective electrodes of said signal supplying electrodes being electrically connected to said conductors.

8. A vibration wave actuator comprising:
   (a) a stack type energy conversion element comprising:
       a first electro-mechanical energy conversion element having a plurality of driving electrodes as a first group, all areas of said first electro-mechanical energy conversion element corresponding to said plurality of driving electrodes being polarized in a first direction, and
       a second electro-mechanical energy conversion element having a plurality of driving electrodes as a second group, all areas of said second electro-mechanical energy conversion element corresponding to said plurality of driving electrodes being polarized in a second direction inverse to the first direction,
       said first and second electro-mechanical energy conversion elements being stacked on each other such that phases of said plurality of electrodes of said first group are shifted relative to the phases of said plurality of electrodes of said second group;
   (b) a vibration member to which said energy conversion element is functionally attached; and
   (c) a contact member which contacts said vibration member, said vibration member and said contact member being relatively moved by vibration generated in said vibration member.

9. An actuator according to claim 8, further comprising a third electro-mechanical energy conversion element having a plurality of driving electrodes as a third group, all areas of said third electro-mechanical energy conversion element corresponding to said plurality of driving electrodes being polarized in the first direction, said second electro-mechanical energy conversion element being stacked between said first and third electro-mechanical energy conversion elements such that phases of said plurality of driving electrodes of said third group coincide with phases of said plurality of driving electrodes of said first group.

10. An actuator according to claim 9, wherein specific driving electrodes of said plurality of driving electrodes of said first and third groups which are in phase are electrically connected to each other via respective conductors formed in respective through holes, such that each conductor is not electrically connected to said plurality of driving electrodes of said second group.

11. An actuator according to claim 10, further comprising a signal supplying element stacked on said first, second, and third electro-mechanical energy conversion elements, said signal supplying element being disposed at an exposed surface position and having a plurality of signal supplying electrodes, respective electrodes of said signal supplying electrodes being electrically connected to said conductors.

12. A driving system using said actuator defined in claim 8 as a driving source.

13. A vibration wave actuator comprising:
   (a) a stack type energy conversion element comprising:
      a first electro-mechanical energy conversion element having a plurality of driving electrodes as a first group,
      a second electro-mechanical energy conversion element having a plurality of driving electrodes as a second group, and
      a third electro-mechanical energy conversion element having a plurality of driving electrodes as a third group,
      wherein said first, second, and third electro-mechanical energy conversion elements are stacked with said second electro-mechanical energy conversion element sandwiched between said first and third electro-mechanical energy conversion elements, phases of said plurality of driving electrodes of said first group being shifted relative to phases of said plurality of driving electrodes of said second group, and phases of said plurality of driving electrodes of said second group being shifted relative to phases of said plurality of driving electrodes of said third group;
   (b) a signal supply device for supplying three-phase AC signals to respective electrodes of said plurality of driving electrodes of each of said first, second, and third groups; and
   (c) a vibration member to which said stack type energy conversion element is functionally attached,
      wherein a contact member which contacts said vibration member and said vibration member are relatively moved by vibrations of said vibration member.

14. An actuator according to claim 13, wherein the number and pitch of said plurality of driving electrodes of said first group are equal to the number and pitch of said plurality of driving electrodes of each of said second and third groups.

15. An actuator according to claim 13, wherein said plurality of driving electrodes of said first and third groups are in phase.

16. An actuator according to claim 15, wherein specific driving electrodes of said plurality of driving electrodes of said first and third groups which are in phase are electrically connected to each other via respective conductors formed in respective through holes, such that each conductor is not electrically connected to said plurality of driving electrodes of said second group.

17. An actuator according to claim 16, wherein each through hole is located between adjacent electrodes of said plurality of electrodes of said second group.

18. An actuator according to claim 16, further comprising a signal supplying element stacked on said first, second, and third electro-mechanical energy conversion elements, said signal supplying element being disposed at an exposed surface position and having a plurality of signal supplying electrodes, respective electrodes of said signal supplying electrodes being electrically connected to said conductor.

19. A driving system using said actuator defined in claim 13 as a driving source.

20. A stack type energy conversion element comprising:
   a first electro-mechanical energy conversion element having three divided driving electrodes as a first group;
   a second electro-mechanical energy conversion element having three divided driving electrodes as a second group; and
   a third electro-mechanical energy conversion element having three divided driving electrodes as a third group,
   wherein said first, second, and third electro-mechanical energy conversion elements are stacked with said second electro-mechanical energy conversion element being sandwiched between said first and third energy conversion elements, phases of said electrodes of said first group are shifted from those of said electrodes of said second group, and the phases of said electrodes of said second group are shifted from those of said electrodes of said third group.

21. An element according to claim 20, wherein the number and pitch of said electrodes of said first group are equal to those of said electrodes of each of said second and third groups.

22. An element according to claim 21, wherein said electrodes of said first and third groups are in phase.

23. An element according to claim 22, wherein specific driving electrodes of said electrodes of said first and third groups which are in phase are electrically connected to each other via a conductor in a formed through hole, and said conductor is not electrically connected to said electrodes of said second group.

24. An element according to claim 23, wherein said through hole is located between said electrodes of said second group.

25. An element according to claim 23, further comprising a signal supplying element stacked on said first, second, and third energy conversion elements, said signal supplying element being disposed at a surface position to be exposed, and having a plurality of signal supplying electrodes, and a specific electrode of said signal supplying electrodes being electrically connected to said conductor.

26. A vibration wave actuator comprising:
   (a) a stack type energy conversion element comprising
      a first electro-mechanical energy conversion element having three divided driving electrodes as a first group,
      a second electro-mechanical energy conversion element having three divided driving electrodes as a second group, and
      a third electro-mechanical energy conversion element having three divided driving electrodes as a third group,
      wherein said first, second, and third electro-mechanical energy conversion elements are stacked with said second electro-mechanical energy conversion element being sandwiched between said first and third energy conversion elements, phases of said electrodes of said first group are shifted from those of said electrodes of said second group, and the phases of said electrodes of said second group are shifted from those of said electrodes of said third group;
   (b) a vibration member to which said energy conversion element is functionally attached; and
   (c) a contact member which contacts said vibration member, said vibration member and said contact member being relatively moved by generated vibration waves.

27. An actuator according to claim 26, wherein specific driving electrodes of said electrodes of said first and third groups which are in phase are electrically connected to each other via a conductor in a formed through hole, and said conductor is not electrically connected to said electrodes of said second group.

28. An actuator according to claim 27, further comprising a signal supplying element stacked on said first, second, and third energy conversion elements, said signal supplying element being disposed at a surface position to be exposed, and having a plurality of signal supplying electrodes, and a specific electrode of said signal supplying electrodes being electrically connected to said conductor.

29. A driving system using said actuator defined in claim 26 as a driving source.

* * * * *

UNITED STATES PATENT AND TRADEMARK OFFICE
CERTIFICATE OF CORRECTION

PATENT NO. : 5,814,919
DATED : September 29, 1998
INVENTOR(S) : ICHIRO OKUMURA

It is certified that error appears in the above-identified patent and that said Letters Patent is hereby corrected as shown below:

On the title page, item [56]:
FOREIGN PATENT DOCUMENTS

"7193201" should read --7-193201--.

Column 1

Line 46, "19B1," should be deleted.

Column 3

Line 53, "annual" should read --annular--.

Column 9

Line 61, "electrodes" should read --electrodes are located--.

Column 10

Line 20, "a parts" should read --parts--.
Line 34, "patter" should read --pattern--.
Line 65, "1/2wavelength" should read --1/2 wavelength--.

UNITED STATES PATENT AND TRADEMARK OFFICE
CERTIFICATE OF CORRECTION

PATENT NO. : 5,814,919
DATED : September 29, 1998
INVENTOR(S) : ICHIRO OKUMURA

It is certified that error appears in the above-identified patent and that said Letters Patent is hereby corrected as shown below:

<u>Column 11</u>

Line 44, "the." should read --the--.

<u>Column 12</u>

Line 39, "motions-produced" should read --motions produced--.

<u>Column 13</u>

Line 24, "piezoelectric" should read --piezoelectric element--.
    Line 33, "what" should read --What--.

Signed and Sealed this

Twenty-seventh Day of July, 1999

Attest:

Q. TODD DICKINSON

*Attesting Officer*      *Acting Commissioner of Patents and Trademarks*